US012757531B2

(12) United States Patent
Im et al.

(10) Patent No.: US 12,757,531 B2
(45) Date of Patent: Oct. 6, 2026

(54) DISPLAY DEVICE

(71) Applicant: Samsung Display Co., LTD., Yongin-si (KR)

(72) Inventors: Hyun Deok Im, Yongin-si (KR); Buem Joon Kim, Yongin-si (KR); Won Ho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 389 days.

(21) Appl. No.: 18/500,226

(22) Filed: Nov. 2, 2023

(65) Prior Publication Data

US 2024/0213411 A1 Jun. 27, 2024

(30) Foreign Application Priority Data

Dec. 22, 2022 (KR) ........................ 10-2022-0182315

(51) Int. Cl.

*H10H 20/831* (2025.01)
*G09G 3/32* (2016.01)
*H10W 90/00* (2026.01)

(52) U.S. Cl.

CPC ........... *H10H 20/8314* (2025.01); *G09G 3/32* (2013.01); *H10W 90/00* (2026.01); *G09G 2300/0819* (2013.01); *G09G 2300/0842* (2013.01); *G09G 2300/0861* (2013.01)

(58) Field of Classification Search

CPC ................. H10H 20/8314; G09G 3/32; G09G 2300/0819; H10K 59/123

See application file for complete search history.

(56) References Cited

U.S. PATENT DOCUMENTS

| | | | | |
|---|---|---|---|---|
| 9,773,761 B2 | | 9/2017 | Do | |
| 11,367,823 B2 | * | 6/2022 | Kim | H01L 25/0753 |
| 12,433,079 B2 | * | 9/2025 | Yun | H01L 25/167 |
| 2018/0175009 A1 | * | 6/2018 | Kim | H01L 25/0753 |
| 2023/0155067 A1 | * | 5/2023 | Im | H01L 25/0753 257/79 |

FOREIGN PATENT DOCUMENTS

| | | | | |
|---|---|---|---|---|
| KR | 10-1490758 | | 2/2015 | |
| WO | 2021215833 | * | 10/2021 | H01L 33/38 |

* cited by examiner

*Primary Examiner* — Mounir S Amer

(74) *Attorney, Agent, or Firm* — Womble Bond Dickinson (US) LLP

(57) ABSTRACT

A display device includes: a first light emitting element disposed in a first light emitting area; a second light emitting element disposed in a second light emitting area; a first contact electrode electrically connected to a first end portion of the first light emitting element; a second contact electrode electrically connected to a second end portion of the first light emitting element; a third contact electrode electrically connected to a first end portion of the second light emitting element; and a connection electrode electrically connected to the second contact electrode and bypassing the first contact electrode to be electrically connected to the third contact electrode.

20 Claims, 19 Drawing Sheets

LD: LD1, LD2, LD3, LD4
ALE: ALE1, ALE2, ALE3
ELT: ELT1, ELT2, ELT3, ELT4, ELT5, ELT6, ELT7, ELT8
CNE: CNE1, CNE2, CNE3
EMA: EMA1, EMA2

LD: LD1, LD2, LD3, LD4
ELT: ELT1, ELT2, ELT3, ELT4, ELT5, ELT6, ELT7, ELT8
CNE: CNE1, CNE2, CNE3

LD: LD1, LD2, LD3, LD4
ELT: ELT1, ELT2, ELT3, ELT4, ELT5, ELT6, ELT7, ELT8
CNE: CNE1, CNE2, CNE3

LD: LD1, LD2, LD3, LD4
ELT: ELT1, ELT2, ELT3, ELT4, ELT5, ELT6, ELT7, ELT8
CNE: CNE1, CNE2, CNE3

LD: LD1, LD2
ELT: ELT1, ELT2, ELT3, ELT4

LD: LD1, LD2
ELT: ELT1, ELT2, ELT3, ELT4

LD: LD1, LD2, LD3
ELT: ELT1, ELT2, ELT3, ELT4, ELT5, ELT6
CNE: CNE1, CNE2

LD: LD1, LD2, LD3
ELT: ELT1, ELT2, ELT3, ELT4, ELT5, ELT6
CNE: CNE1, CNE2

LD: LD1, LD2, LD3
ELT: ELT1, ELT2, ELT3, ELT4, ELT5, ELT6
CNE: CNE1, CNE2

LD: LD1, LD2, LD3
ELT: ELT1, ELT2, ELT3, ELT4, ELT5, ELT6
CNE: CNE1, CNE2

LD: LD1, LD2, LD3
ELT: ELT1, ELT2, ELT3, ELT4, ELT5, ELT6
CNE: CNE1, CNE2

DISPLAY DEVICE

CROSS REFERENCE TO RELATED APPLICATION(S)

This application claims priority to and the benefits of Korean Patent Application No. 10-2022-0182315 under 35 U.S.C. § 119, filed on Dec. 22, 2022, in the Korean Intellectual Property Office, the entire contents of which are incorporated herein by reference.

BACKGROUND

1. Technical Field

Embodiments relate to a display device.

2. Description of the Related Art

Recently, as interest in an information display has increased, research and development for display devices has been conducted.

SUMMARY

Embodiments provide a display device capable of minimizing a non-light emitting area of a pixel.

Embodiments is not limited to those set forth herein. The above and other embodiments will become more apparent to one of ordinary skill in the art to which the disclosure pertains by referencing the detailed description of the disclosure given below.

In an embodiment, a display device may include: a first light emitting element disposed in a first light emitting area; a second light emitting element disposed in a second light emitting area; a first contact electrode electrically connected to a first end portion of the first light emitting element; a second contact electrode electrically connected to a second end portion of the first light emitting element; a third contact electrode electrically connected to a first end portion of the second light emitting element; and a connection electrode electrically connected to the second contact electrode and bypassing the first contact electrode to be electrically connected to the third contact electrode.

The connection electrode and the first contact electrode may be disposed on a same layer.

The first contact electrode and the second contact electrode may be disposed on the same layer.

The display device may further include an insulating layer disposed between the first contact electrode and the second contact electrode.

The display device may further include a non-light emitting area disposed between the first light emitting area and the second light emitting area.

The first contact electrode, the second contact electrode, and the third contact electrode may not overlap the non-light emitting area.

The connection electrode may overlap the non-light emitting area.

The display device may further include electrodes spaced apart from each other in the first light emitting area and the second light emitting area.

The first light emitting element and the second light emitting element may be disposed between the electrodes.

The display device may further include a fourth contact electrode electrically connected to a second end portion of the second light emitting element.

In an embodiment, a display device may include: a first light emitting area, a second light emitting area, and a non-light emitting area between the first light emitting area and the second light emitting area; a first light emitting element disposed in the first light emitting area; a second light emitting element disposed in the second light emitting area; a first contact electrode electrically connected to a first end portion of the first light emitting element; a second contact electrode electrically connected to a second end portion of the first light emitting element; a third contact electrode electrically connected to a first end portion of the second light emitting element; and a first connection electrode electrically connecting the second contact electrode and the third contact electrode, wherein the first contact electrode, the second contact electrode, and the third contact electrode may not overlap the non-light emitting area.

The first connection electrode may extend to cross the non-light emitting area.

The first connection electrode, the first contact electrode, the second contact electrode, and the third contact electrode may be disposed on a same layer.

The display device may further include a fourth contact electrode electrically connected to a second end portion of the second light emitting element.

The fourth contact electrode may not overlap the non-light emitting area.

The display device may further include a third light emitting element disposed in the first light emitting area.

The display device may further include a fifth contact electrode electrically connected to a first end portion of the third light emitting element.

The fifth contact electrode may not overlap the non-light emitting area.

The display device may further include a second connection electrode electrically connecting the fourth contact electrode and the fifth contact electrode.

The second connection electrode may extend to cross the non-light emitting area.

Details of other embodiments are included in the detailed description and drawings.

According to the above-described embodiment, by electrically connecting contact electrodes through a connection electrode bypassing the contact electrodes, a partially bent or curved structure for connecting the contact electrodes to each other may be omitted. Accordingly, a non-light emitting area of a pixel in which a light emitting element is lost (or is not disposed) may be minimized.

Effects of embodiments of the disclosure are not limited by what is illustrated in the above, and more various effects are included in the disclosure.

DETAILED DESCRIPTION OF THE EMBODIMENTS

Figure 1:
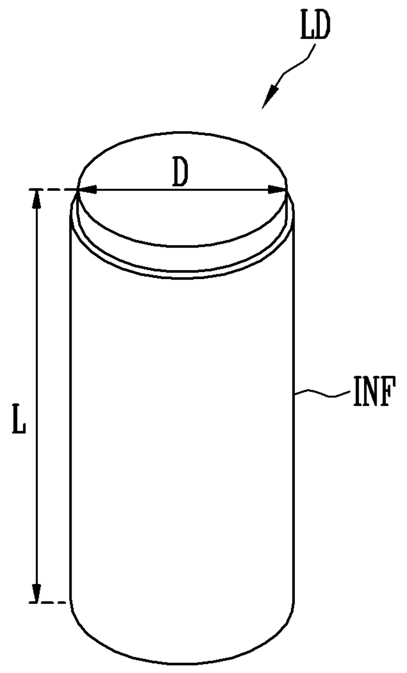
FIG. 1 illustrates a schematic perspective view of a light emitting element according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, embodiments of the disclosure will be described in detail with reference to the accompanying drawings.

Figure 2:
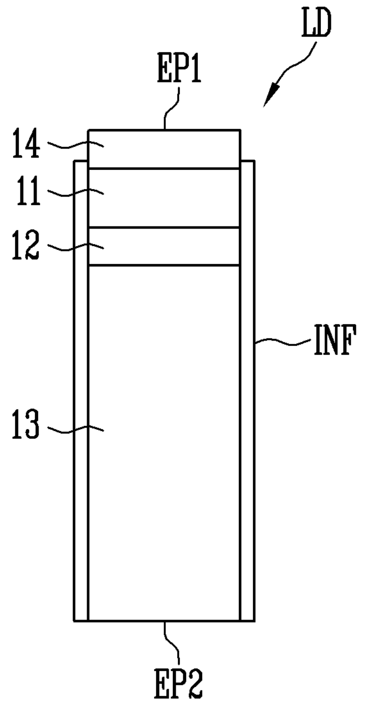
FIG. 2 illustrates a schematic cross-sectional view of a light emitting element according to an embodiment.

FIG. 1 illustrates a schematic perspective view of a light emitting element according to an embodiment. FIG. 2 illustrates a schematic cross-sectional view of a light emitting element according to an embodiment. FIG. 1 and FIG. 2 illustrate a cylindrical shape light emitting element LD, but a type and/or shape of the light emitting element LD is not limited thereto.

Referring to FIG. 1 and FIG. 2, a light emitting element LD may include a first semiconductor layer 11, an active layer 12, a second semiconductor layer 13, and/or an electrode layer 14.

The light emitting element LD may be formed to have a cylindrical shape extending along one direction. The light emitting element LD may have a first end portion EP1 and a second end portion EP2. One of the first and second semiconductor layers 11 and 13 may be disposed on the first end portion EP1 of the light emitting element LD. The remaining one of the first and second semiconductor layers 11 and 13 may be disposed on the second end portion EP2 of the light emitting element LD. For example, the first semiconductor layer 11 may be disposed on the first end portion EP1 of the light emitting element LD, and the second semiconductor layer 13 may be disposed on the second end portion EP2 of the light emitting element LD.

In some embodiments, the light emitting element LD may be a light emitting element formed in a cylindrical shape through an etching method or the like. In the description, the "cylindrical shape" may include a rod-like shape or bar-like shape with an aspect ratio greater than 1, such as a circular cylinder or a polygonal cylinder, but a shape of a cross-section thereof is not limited thereto.

The light emitting element LD may have a size as small as a nanometer scale to a micrometer scale. For example, the light emitting element LD may each have a diameter D (or width) and/or a length L in a range of a nanometer scale to a micrometer scale. However, the size of the light emitting element LD is not limited thereto, and the size of the light emitting element LD may be variously changed according to design conditions of various devices with a light emitting device including the light emitting element LD as a light source, for example, a display device.

The first semiconductor layer 11 may be a first conductive semiconductor layer. For example, the first semiconductor layer 11 may include a p-type semiconductor layer. For example, the first semiconductor layer 11 may include at least one semiconductor material of InAlGaN, GaN, AlGaN, InGaN, and AlN, and may include a p-type semiconductor layer doped with a first conductive dopant such as Mg. However, the material included in the first semiconductor layer 11 is not limited thereto, and the first semiconductor layer 11 may be made of various materials.

The active layer 12 may be disposed between the first semiconductor layer 11 and the second semiconductor layer 13. The active layer 12 may include one of a single well structure, a multi-well structure, a single quantum well structure, a multi-quantum well (MQW) structure, a quantum dot structure, and a quantum line structure, but embodiments are not limited thereto. The active layer 12 may include GaN, InGaN, InAlGaN, AlGaN, or AlN, and may include various other materials.

In case that a voltage of a threshold voltage or more is applied to respective end portions of the light emitting element LD, the light emitting element LD may emit light in case that electron-hole pairs are combined in the active layer 12. By controlling the light emitting of the light emitting element LD, the light emitting element LD may be used as a light source for various light emitting devices in addition to pixels of a display device.

The second semiconductor layer 13 may be disposed to on the active layer 12, and may include a semiconductor layer of a type different from that of the first semiconductor layer 11. The second semiconductor layer 13 may include an n-type semiconductor layer. For example, the second semiconductor layer 13 may include a semiconductor material of one of InAlGaN, GaN, AlGaN, InGaN, and AlN, and may include an n-type semiconductor layer doped with a second conductive dopant such as Si, Ge, Sn, or the like. However, the material included in the second semiconductor layer 13 is not limited thereto, and the second semiconductor layer 13 may be made of various materials.

The electrode layer 14 may be disposed on the first end portion EP1 and/or the second end portion EP2 of the light emitting element LD. FIG. 2 illustrates the case in which the electrode layer 14 is formed on the first semiconductor layer 11, but embodiments are not limited thereto. For example, a separate electrode layer may be further disposed on the second semiconductor layer 13.

The electrode layer 14 may include a transparent metal or transparent metal oxide. As an example, the electrode layer 14 may include at least one of an indium tin oxide (ITO), an indium zinc oxide (IZO), and a zinc tin oxide (ZTO), but embodiments are not limited thereto. As such, in case that the electrode layer 14 is made of the transparent metal or transparent metal oxide, light generated in the active layer 12 of the light emitting element LD may transmit through the electrode layer 14 to be emitted to the outside of the light emitting element LD.

An insulating film INF may be formed on a surface of the light emitting element LD. The insulating film INF may be disposed (e.g., directly disposed) on surfaces of the first semiconductor layer 11, the active layer 12, the second semiconductor layer 13, and/or the electrode layer 14. The insulating film INF may expose the first and second end portions EP1 and EP2 of the light emitting element LD having different polarities. In some embodiments, the insulating film INF may expose side portions of the electrode layer 14 and/or the second semiconductor layer 13 that are adjacent to the first and second end portions EP1 and EP2 of the light emitting element LD.

The insulating film INF may prevent an electrical short circuit that occurs in case that the active layer 12 contacts conductive materials other than the first and second semiconductor layers 11 and 13. The insulating film INF may minimize surface defects of the light emitting elements LD to improve lifespan and luminous efficiency of the light emitting elements LD.

The insulating film INF may include at least one of a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), and a titanium oxide ($TiO_x$). For example, the insulating film INF may be formed as a double layer, and respective layers forming the double layer may include different materials. For example, the insulating film INF may be formed as a double layer made of an aluminum oxide ($AlO_x$) and a silicon oxide ($SiO_x$), but embodiments are not limited thereto. In some embodiments, the insulating film INF may be omitted.

A light emitting device including the light emitting element LD described above may be used in various types of devices that require a light source in addition to a display device. For example, the light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

Figure 3:
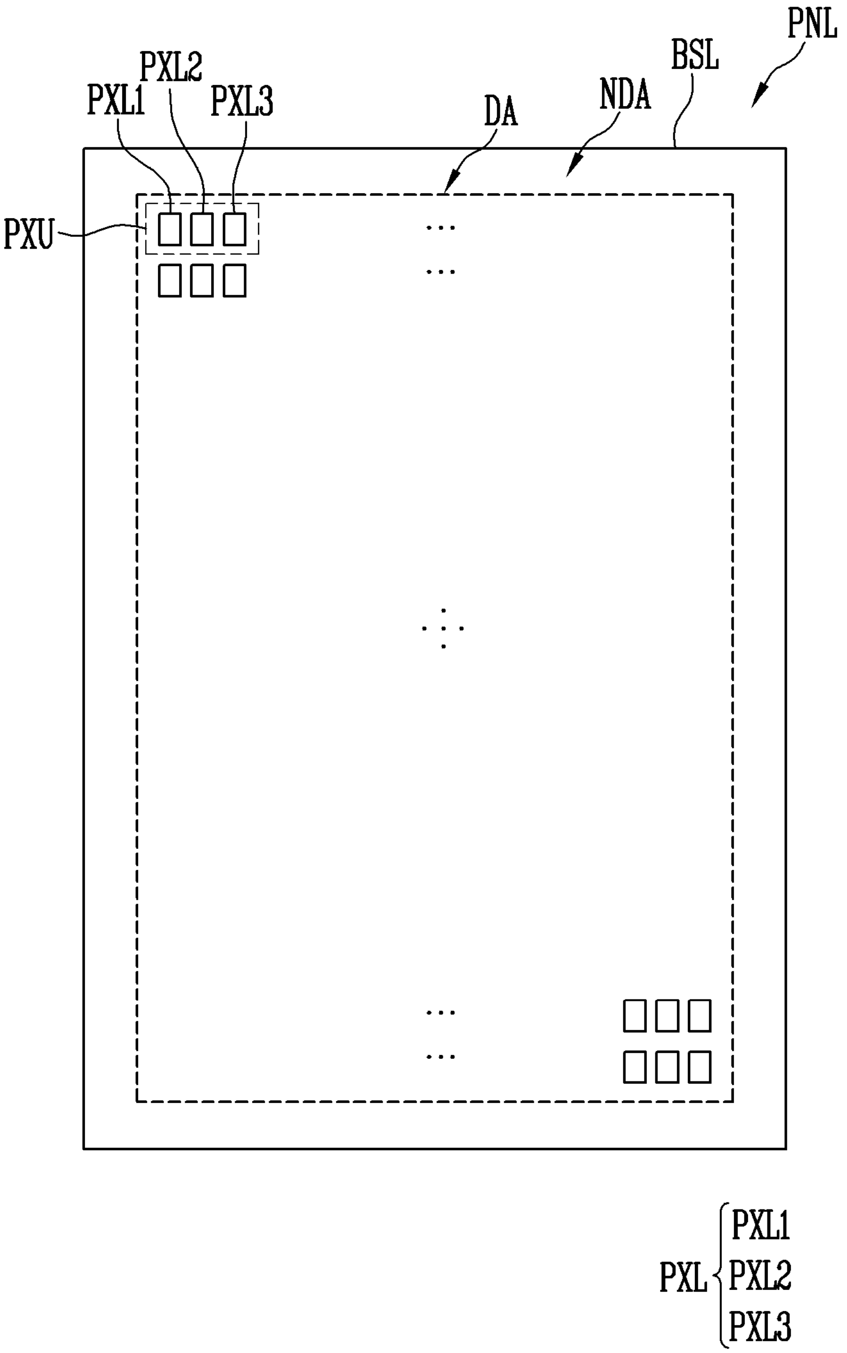
FIG. 3 illustrates a schematic top plan view of a display device according to an embodiment.

FIG. 3 illustrates a schematic top plan view of a display device according to an embodiment.

FIG. 3 illustrates a display device, e.g., a display panel PNL provided in the display device as an example of an electronic device that uses the light emitting element LD described in the embodiments of FIG. 1 and FIG. 2 as a light source.

For descriptive convenience, FIG. 3 illustrates a structure of the display panel PNL based on a display area DA. However, in some embodiments, at least one driving circuit portion (for example, at least one of a scan driver and a data driver), wires, and/or pads, which are not shown, may be further disposed in the display panel PNL.

Referring to FIG. 3, the display panel PNL and a base layer BSL for forming the display panel include the display area DA for displaying an image and a non-display area NDA excluding the display area DA. The display area DA may form a screen on which an image is displayed, and the non-display area NDA may be the remaining area except for the display area DA.

A pixel unit PXU may be disposed in the display area DA. The pixel unit PXU may include a first pixel PXL1, a second pixel PXL2, and/or a third pixel PXL3. Hereinafter, referring to at least one of the first pixel PXL1, the second pixel PXL2, and the third pixel PXL3, or comprehensively referring to two or more types of pixels thereof, they will be referred to as a "pixel PXL" or "pixels PXL".

The pixels PXL may be regularly arranged according to a stripe or PENTILE™ arrangement structure. However, the arrangement structure of the pixels PXL is not limited thereto, and the pixels PXL may be arranged in the display area DA in various structures and/or methods.

In some embodiments, two or more types of pixels PXL emitting light of different colors may be disposed in the display area DA. For example, in the display area DA, the first pixels PXL1 emitting light of the first color, the second pixels PXL2 emitting light of the second color, and the third pixels PXL3 emitting light of the third color may be arranged. At least one of the first to third pixels PXL1, PXL2, and PXL3 disposed to be adjacent to each other may form one pixel unit PXU that emits light of various colors. For example, each of the first to third pixels PXL1, PXL2, and PXL3 may be a pixel that emits light of a certain color. In some embodiments, the first pixel PXL1 may be a red pixel that emits red light, the second pixel PXL2 may be a green pixel that emits green light, and the third pixel PXL3 may be a blue pixel that emits blue light, but embodiments are not limited thereto.

In an embodiment, the first pixel PXL1, the second pixel PXL2, and the third pixel PXL3 are provided with light emitting elements of the same color, and include color conversion layers and/or color filter layers of different colors disposed on respective light emitting elements, so that they may emit light of the first color, the second color, and the third color, respectively. In another example, the first pixel PXL1, the second pixel PXL2, and the third pixel PXL3 are each provided with a first color light emitting element, a second color light emitting element, and a third color light emitting element as a light source, respectively, so that they respectively emit light of the first color, second color, and third color. However, the color, type, and/or number of pixels PXL forming each pixel unit PXU are not limited thereto. For example, the color of light emitted by each pixel PXL may be changed variously.

The pixel PXL may include at least one light source driven by a control signal (for example, a scan signal and a data signal) and/or a power source (for example, a first power source and a second power source). In an embodiment, the light source may include at least one light emitting device LD according to one of the embodiments of FIG. 1 and FIG. 2, for example, ultra-small cylindrical shape light emitting elements LD having a size as small as nanometer scale to micrometer scale. However, embodiments are not limited thereto, and various types of light emitting elements LD may be used as a light source of the pixel PXL.

In an embodiment, each pixel PXL may be formed as an active pixel. However, the type, structure, and/or driving method of pixels PXL that are applied to the display device are not limited thereto. For example, each pixel PXL may be formed as a pixel of a passive or active light emitting display device of various structures and/or driving methods.

Figure 4:
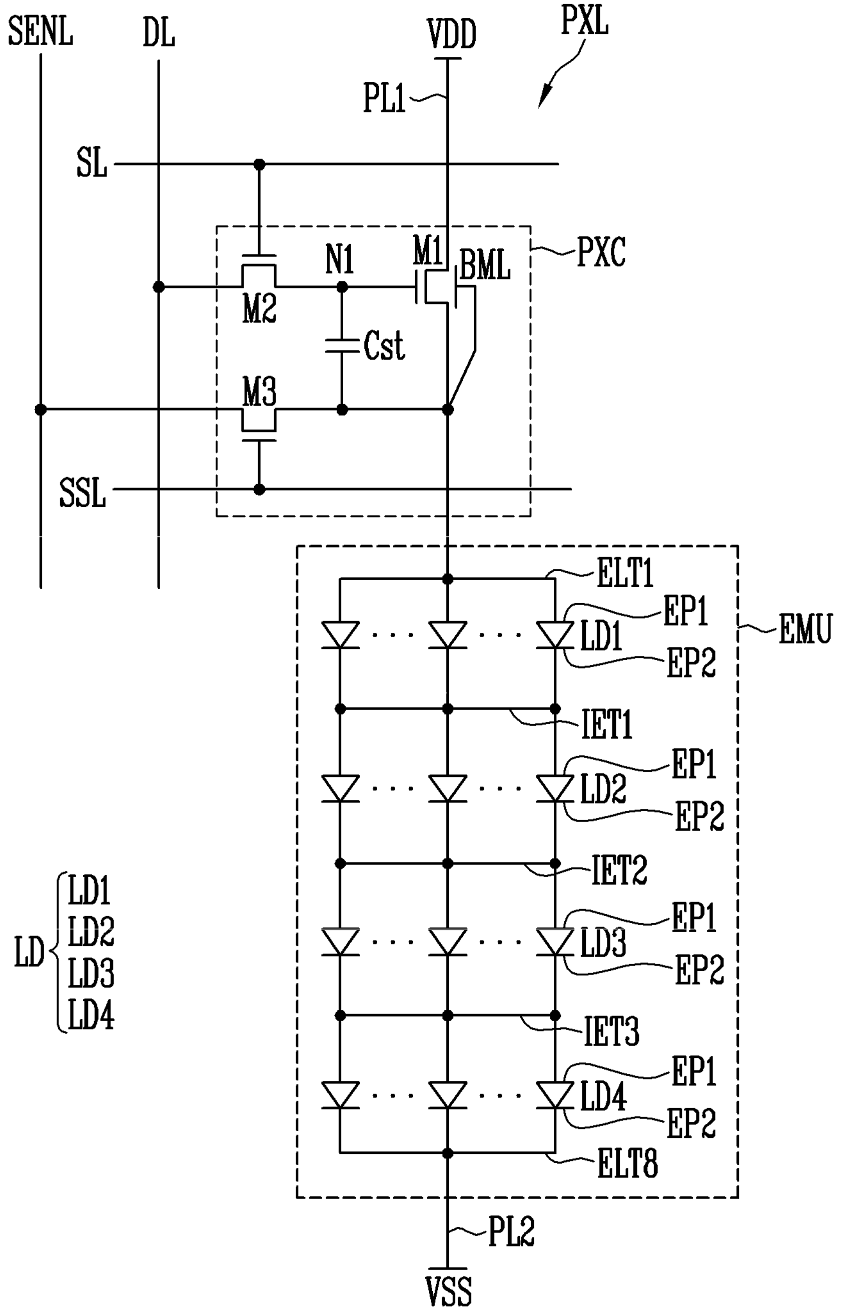
FIG. 4 illustrates a schematic diagram of an equivalent circuit of a pixel according to an embodiment.

FIG. 4 illustrates a schematic diagram of an equivalent circuit of a pixel according to an embodiment.

The pixel PXL shown in FIG. 4 may be one of the first pixel PXL1, the second pixel PXL2, and the third pixel PXL3 provided in the display panel PNL of FIG. 3. The first pixel PXL1, the second pixel PXL2, and the third pixel PXL3 may have substantially the same or similar structure.

Referring to FIG. 4, the pixel PXL may further include a light emitting part EMU for generating light at luminance corresponding to a data signal, and a pixel circuit PXC for driving a light emitting part EMU.

The pixel circuit PXC may be connected between a first power source VDD and the light emitting part EMU. The pixel circuit PXC may be connected to a scan line SL and a data line DL of the pixel PXL to control an operation of the light emitting part EMU in response to a scan signal and a data signal supplied from the scan line SL and the data line DL. The pixel circuit PXC may be further selectively connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power source VDD and a first contact electrode ELT1. A gate electrode of the first transistor M1 may be connected to a first node N1. The first transistor M1 may control a driving current supplied to the light emitting part EMU in response to a voltage of the first node N1. For example, the first transistor M1 may be a driving transistor that controls a driving current of the pixel PXL.

In an embodiment, the first transistor M1 may optionally include a lower conductive layer BML (also referred to as a "lower electrode", "back gate electrode", or "lower light blocking layer"). The gate electrode of the first transistor M1 and the lower conductive layer BML may overlap each other with an insulating layer interposed between the first transistor M1 and the lower conductive layer BML. In an embodiment, the lower conductive layer BML may be connected to an electrode of the first transistor M1, for example a source or drain electrode thereof.

In case that the first transistor M1 includes the lower conductive layer BML, by applying a back-biasing voltage to the lower conductive layer BML of the first transistor M1 in case that the pixel PXL is driven, a back-biasing technique (or a sync technique) of moving a threshold voltage of the first transistor M1 in a negative or positive direction may be applied. For example, by connecting the lower conductive layer BML to the source electrode of the first transistor M1 to apply a source-sync technique, the threshold voltage of the first transistor M1 may be moved in the negative or positive direction. In case that the lower conductive layer BML is disposed under a semiconductor pattern layer forming a channel of the first transistor M1, the lower conductive layer BML may function as a light blocking pattern layer to stabilize an operating characteristic of the first transistor M1. However, the function and/or utilization method of the lower conductive layer BML is not limited thereto.

The second transistor M2 may be connected between the data line DL and the first node N1. A gate electrode of the second transistor M2 may be connected to the scan line SL. In case that a scan signal of a gate-on voltage (for example, a high level voltage) is supplied from the scan line SL, the second transistor M2 may be turned on to connect (e.g., electrically connect) the data line DL and the first node N1.

For each frame period, a data signal of the corresponding frame may be supplied to the data line DL, and the data signal may be transmitted to the first node N1 through the turned-on second transistor M2 during a period in which the scan signal of the gate-on voltage is supplied. For example, the second transistor M2 may be a switching transistor for transmitting each data signal to the inside of the pixel PXL.

An electrode of the storage capacitor Cst may be connected to the first node N1, and another electrode of the storage capacitor Cst may be connected to a second electrode of the first transistor M1. The storage capacitor Cst may be charged with a voltage corresponding to the data signal supplied to the first node N1 during each frame period.

The third transistor M3 may be connected between the first contact electrode ELT1 (or the second electrode of the first transistor M1) and the sensing line SENL. A gate electrode of the third transistor M3 may be connected to a sensing signal line SSL. The third transistor M3 may transmit a voltage applied to the first contact electrode ELT1 to the sensing line SENL according to a sensing signal supplied to the sensing signal line SSL. The voltage transmitted through the sensing line SENL may be provided to an external circuit (for example, a timing controller), and the external circuit may detect characteristic information (for example, a threshold voltage of the first transistor M1) of each pixel PXL based on the supplied voltage. The detected characteristic information may be used to convert (or modify) image data so that a characteristic deviation between the pixels PXL is compensated.

In FIG. 4, all the transistors included in the pixel circuit PXC are illustrated as N-type transistors, but embodiments are not limited thereto. For example, at least one of the first, second, and third transistors M1, M2, and M3 may be formed as a p-type transistor.

The structure and driving method of the pixel PXL may be variously changed. For example, the pixel circuit PXC may be formed as a pixel circuit having various structures and/or driving methods in addition to that of the embodiment shown in FIG. 4.

For example, the pixel circuit PXC may not include the third transistor M3. The pixel circuit PXC may further include other circuit elements such as a compensation transistor for compensating for a threshold voltage of the first transistor M1, an initialization transistor for initializing the voltage of the first node N1 and/or of the first contact electrode ELT1, a light emission control transistor for controlling a period in which a driving current is supplied to the light emitting part EMU, and/or a boosting capacitor for boosting the voltage of the first node N1.

The light emitting part EMU may include at least one light emitting element LD connected between the first power source VDD and a second power source VSS, for example, light emitting elements LD.

For example, the light emitting part EMU may include the first contact electrode ELT1 connected to the first power source VDD through the pixel circuit PXC and a first power line PL1, a fifth contact electrode ELT5 connected to the second power source VSS through a second power line PL2, and light emitting elements LD connected between the first contact electrode ELT1 and an eighth contact electrode ELT8.

The first and second power sources VDD and VSS may have different potentials so that the light emitting elements LD may emit light. For example, the first power source VDD may be set as a high potential power source, and the second power source VSS may be set as a low potential power source.

In an embodiment, the light emitting part EMU may include at least one serial stage. Each serial stage may include a pair of electrodes (for example, two electrodes) and at least one light emitting element LD connected in a forward-bias direction between the pair of electrodes. Here, the number of serial stages forming the light emitting part EMU and the number of light emitting elements LD forming each serial stage are not limited thereto. For example, the number of the light emitting elements LD forming respective serial stages may be the same or different from each other, but the number of the light emitting elements LD is not limited thereto.

For example, the light emitting part EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first series stage may include the first contact electrode ELT1, a first intermediate electrode IET1, and at least one first light emitting element LD1 connected between the first contact electrode ELT1 and the first intermediate electrode IET1. A first end portion EP1 of the first light emitting element LD1 may be connected to the first contact electrode ELT1, and a second end portion EP2 of the first light emitting element LD1 may be connected to the first intermediate electrode IET1.

The second series stage may include the first intermediate electrode IET1, a second intermediate electrode IET2, and at least one second light emitting element LD2 connected between the first intermediate electrode IET1 and the second intermediate electrode IET2. A first end portion EP1 of the second light emitting element LD2 may be connected to the first intermediate electrode IET1, and a second end portion EP2 of the second light emitting element LD2 may be connected to the second intermediate electrode IET2.

The third series stage may include the second intermediate electrode IET2, a third intermediate electrode IET3, and at least one third light emitting element LD3 connected between the second intermediate electrode IET2 and the third intermediate electrode IET3. A first end portion EP1 of the third light emitting element LD3 may be connected to the second intermediate electrode IET2, and a second end portion EP2 of the third light emitting element LD3 may be connected to the third intermediate electrode IET3.

The fourth series stage may include the third intermediate electrode IET3, the eighth contact electrode ELT8, and at least one fourth light emitting element LD4 connected between the third intermediate electrode IET3 and the eighth contact electrode ELT8. A first end portion EP1 of the fourth light emitting element LD4 may be connected to the third intermediate electrode IET3, and a second end portion EP2 of the fourth light emitting element LD4 may be connected to the eighth contact electrode ELT8.

A first electrode of the light emitting part EMU, for example, the first contact electrode ELT1 may be an anode electrode of the light emitting part EMU. A last electrode of the light emitting part EMU, for example, the eighth contact electrode ELT8 may be a cathode electrode of the light emitting part EMU.

In case that the light emitting elements LD are connected in a serial/parallel structure, power efficiency may be improved as compared with that the same number of light emitting elements LD are connected only in parallel. In the pixel PXL in which the light emitting elements LD are connected in a serial/parallel structure, although a short circuit defect occurs at some of the serial stages, since a luminance may be displayed through the light emitting elements LD in the remaining serial stages, the possibility of dark spot defects of the pixel PXL may be reduced. However, embodiments are not limited thereto, and the light emitting part EMU may be formed by connecting the light emitting elements LD only in series or only in parallel.

Each of the light emitting elements LD may include at least one electrode (for example, the first contact electrode ELT1), the first end portion EP1 (for example, a p-type end portion) connected to the first power source VDD via the pixel circuit PXC and/or the first power line PL1, and the second end portion EP2 (for example, an n-type end portion) connected to the second power source VSS via at least one other electrode (for example, the eighth contact electrode ELT8) and the second power line PL2. For example, the light emitting elements LD may be connected in a forward-bias direction between the first power source VDD and the second power source VSS. The light emitting elements LD connected to the forward-bias direction may form the effective light sources of the light emitting part EMU.

In case that a driving current is supplied through the corresponding pixel circuit PXC, the light emitting elements LD may emit light with luminance corresponding to the driving current. For example, during each frame period, the pixel circuit PXC may supply a driving current corresponding to a gray value to be displayed in the corresponding frame to the light emitting part EMU. Accordingly, in case that the light emitting elements LD emit light with luminance corresponding to the driving current, the light emitting part EMU may display the luminance corresponding to the driving current.

Figure 5:
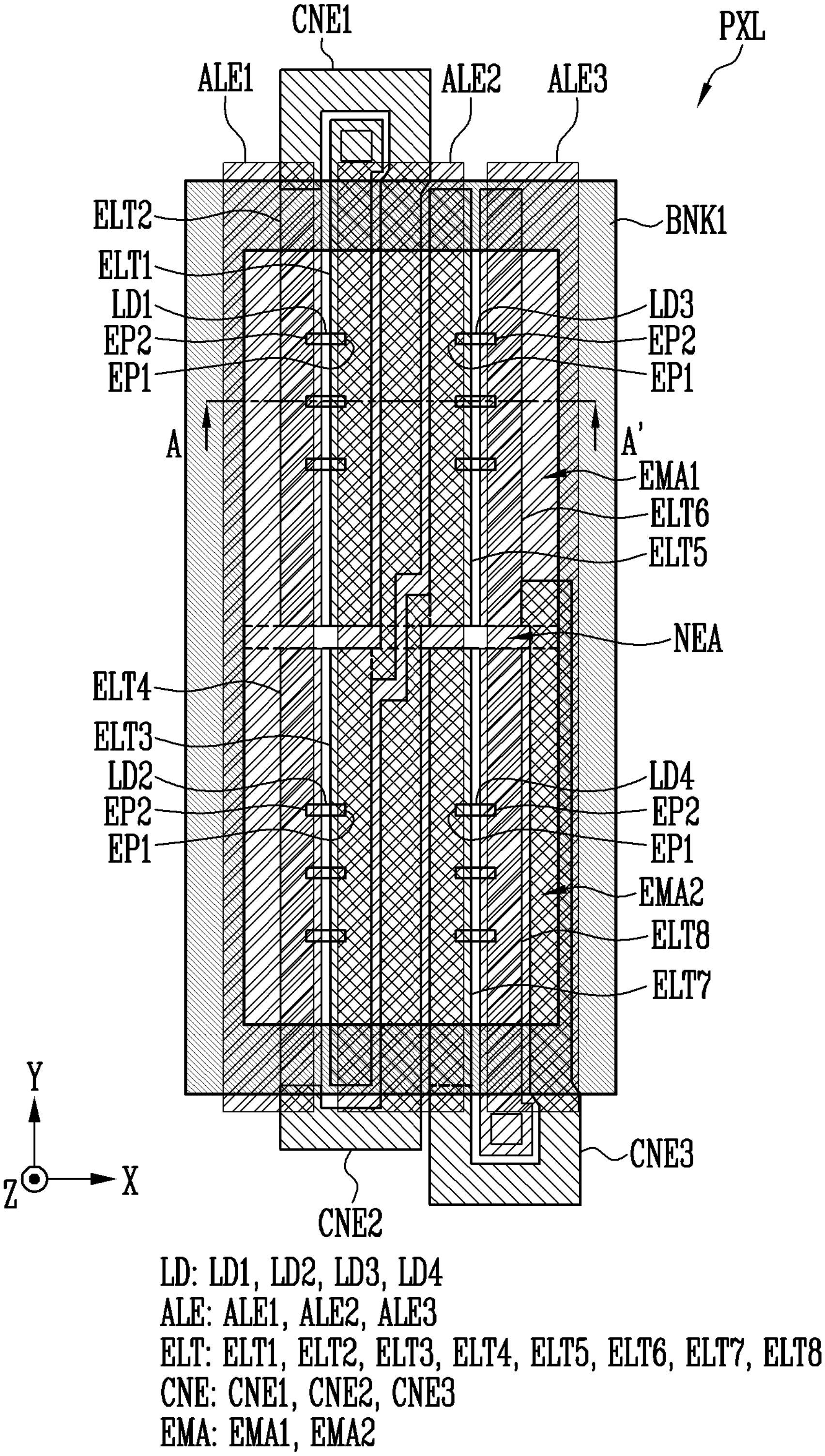
FIG. 5 and FIG. 6 illustrate schematic top plan views of a pixel according to an embodiment.
Figure 6:
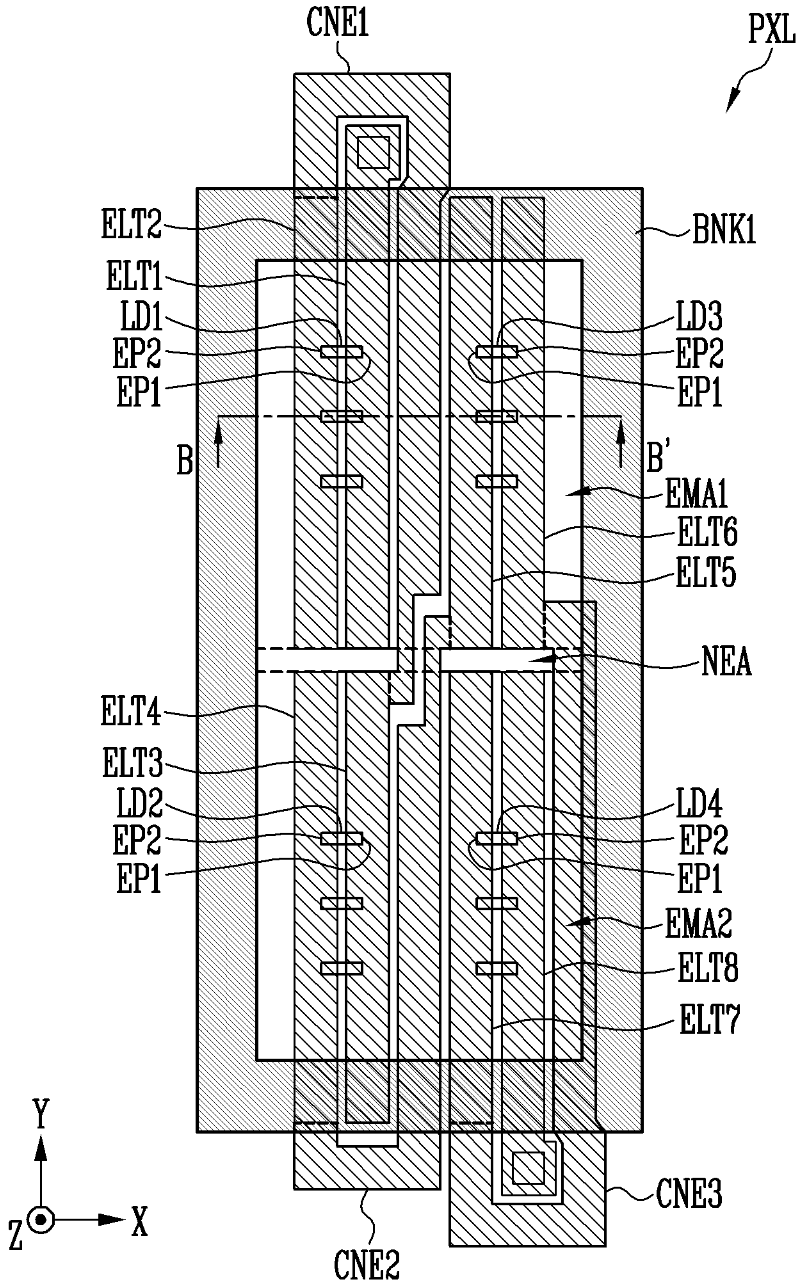
Figure 7:
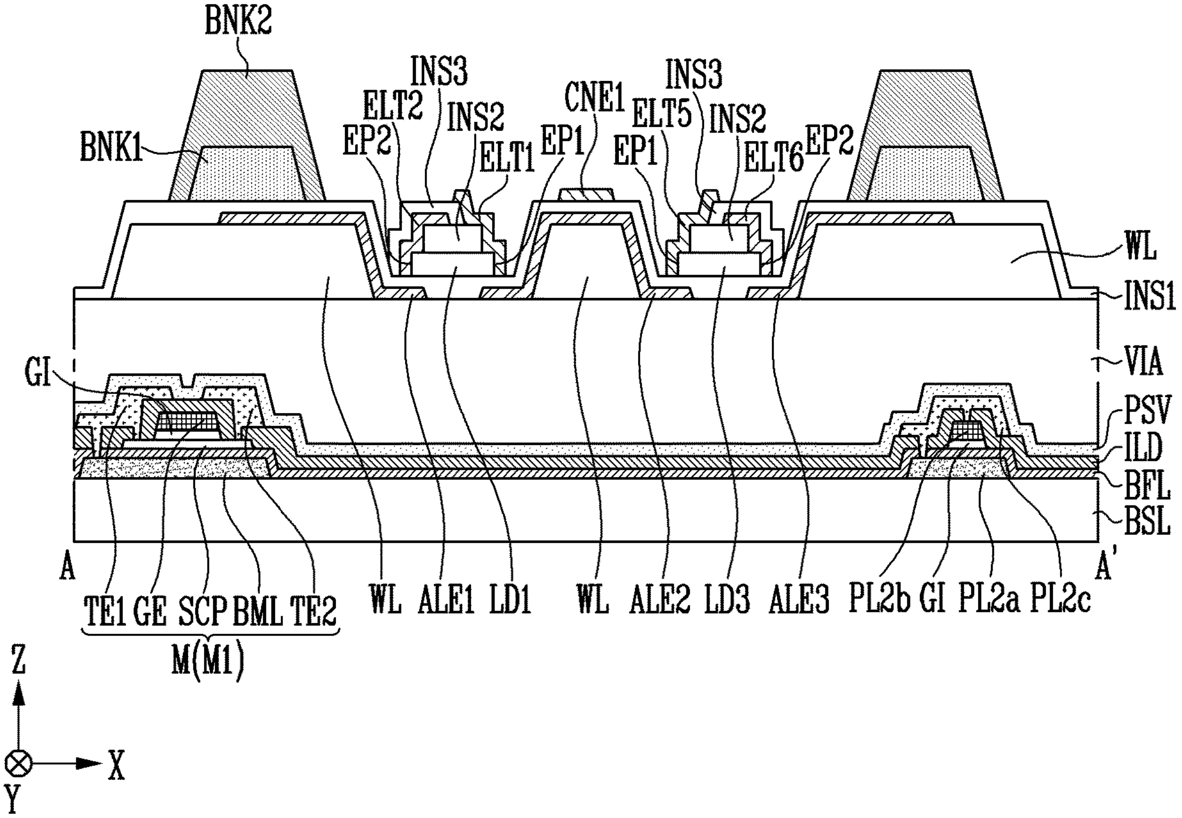
FIG. 7 illustrates a schematic cross-sectional view taken along line A-A' of FIG. 5.
Figure 8:
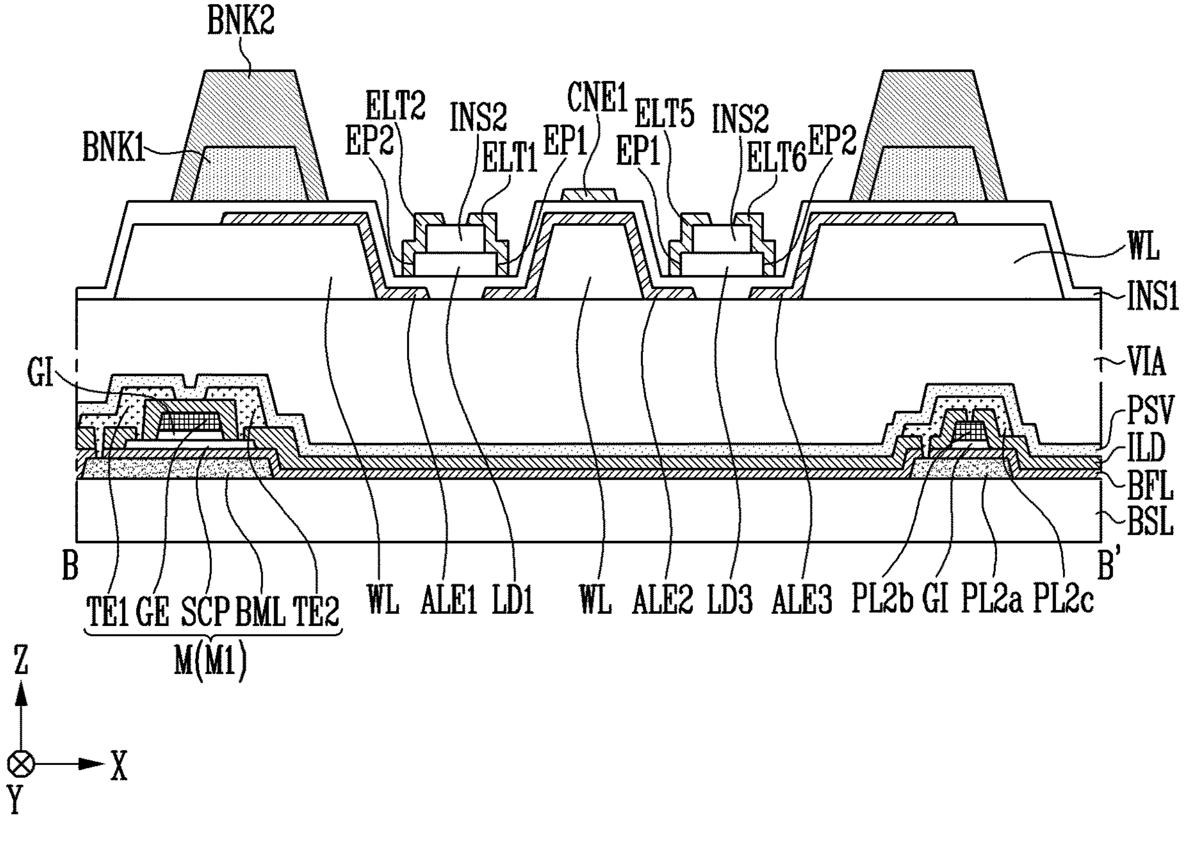
FIG. 8 illustrates a schematic cross-sectional view taken along line B-B' of FIG. 6.

FIG. 5 and FIG. 6 illustrate schematic top plan views of a pixel according to an embodiment. FIG. 7 illustrates a schematic cross-sectional view taken along line A-A' of FIG. 5. FIG. 8 illustrates a schematic cross-sectional view taken along line B-B' of FIG. 6.

As an example, FIG. 5 and FIG. 6 may be one of the first to third pixels PXL1, PXL2, and PXL3 forming the pixel unit PXU of FIG. 3, and the first to third pixels PXL1, PXL2, and PXL3 may be substantially the same or similar to each other. FIG. 5 and FIG. 6 illustrate the embodiment in which each pixel PXL includes the light emitting elements LD disposed in the four serial stages as shown in FIG. 4, but the number of serial stages of each pixel PXL may be variously changed according to embodiments. In FIG. 6, electrodes ALE are omitted for descriptive convenience.

Referring to FIG. 5 and FIG. 6, a pixel PXL may include a first light emitting area EMA1, a second light emitting area EMA2, and a non-light emitting area NEA, respectively. The non-light emitting area NEA may be disposed between the first light emitting area EMA1 and the second light emitting area EMA2. The first light emitting area EMA1 and the second light emitting area EMA2 may be a light emitting area including the light emitting elements LD. A first bank BNK1 may surround the first light emitting area EMA1 and the second light emitting area EMA2.

The first bank BNK1 may include an opening overlapping the first light emitting area EMA1 and the second light emitting area EMA2. The opening of the first bank BNK1 may provide a space in which light emitting elements LD, which will be described below, may be provided.

Each pixel PXL may include electrodes ALE, the light emitting elements LD, contact electrodes ELT, and/or connection electrodes CNE.

The electrodes ALE may be disposed in the first light emitting area EMA1 and the second light emitting area EMA2. The electrodes ALE may extend along a second direction (e.g., Y-axis direction), and may be spaced apart from each other along a first direction (e.g., X-axis direction).

First to third electrodes ALE1, ALE2, and ALE3 may extend along the second direction (e.g., Y-axis direction), respectively, and may be spaced apart from each other along the first direction (e.g., X-axis direction) to be sequentially disposed. Some of the electrodes ALE may be connected to the pixel circuit (PXC of FIG. 4) and/or a power line through a contact hole. In some embodiments, some of the electrodes ALE may be connected (e.g., electrically connected) to some of the contact electrodes ELT through a contact hole.

A pair of electrodes ALE adjacent to each other may receive different signals in an alignment process/step of the light emitting elements LD. For example, in case that the first to third electrodes ALE1, ALE2, and ALE3 are sequentially arranged along the first direction (e.g., X-axis direction), the first electrode ALE1 and the second electrode ALE2 may be supplied with different alignment signals, and the second electrode ALE2 and the third electrode ALE3 may be supplied with different alignment signals.

Each of the light emitting elements LD may be aligned between a pair of electrodes ALE in the light emitting area EMA. Each of the light emitting elements LD may be connected (e.g., electrically connected) between a pair of contact electrodes ELT.

The first light emitting element LD1 may be aligned between the first and second electrodes ALE1 and ALE2 in the first light emitting area EMA1. The first light emitting element LD1 may be connected (e.g., electrically connected) between the first and second contact electrodes ELT1 and ELT2. For example, a first end portion EP1 of the first light emitting element LD1 may be connected (e.g., electrically connected) to the first contact electrode ELT1, and a second end portion EP2 of the first light emitting element LD1 may be connected (e.g., electrically connected) to the second contact electrode ELT2.

The second light emitting element LD2 may be aligned between the first and second electrodes ALE1 and ALE2 in the second light emitting area EMA2. The second light emitting element LD2 may be connected (e.g., electrically connected) between the third and fourth contact electrodes ELT3 and ELT4. For example, a first end portion EP1 of the second light emitting element LD2 may be connected (e.g., electrically connected) to the third contact electrode ELT3, and a second end portion EP2 of the second light emitting element LD2 may be connected (e.g., electrically connected) to the fourth contact electrode ELT4.

The third light emitting element LD3 may be aligned between the second and third electrodes ALE2 and ALE3 in the first light emitting area EMA1. The third light emitting element LD3 may be connected (e.g., electrically connected) between the fifth and sixth contact electrodes ELT5 and ELT6. For example, a first end portion EP1 of the third light emitting element LD3 may be connected (e.g., electrically connected) to the fifth contact electrode ELT5, and a second end portion EP2 of the third light emitting element LD3 may be connected (e.g., electrically connected) to the sixth contact electrode ELT6.

The fourth light emitting element LD4 may be aligned between the second and third electrodes ALE2 and ALE3 in the second light emitting area EMA2. The fourth light emitting element LD4 may be connected (e.g., electrically connected) between the seventh and eighth contact electrodes ELT7 and ELT8. For example, a first end portion EP1 of the fourth light emitting element LD4 may be connected (e.g., electrically connected) to the seventh contact electrode ELT7, and a second end portion EP2 of the fourth light emitting element LD4 may be connected (e.g., electrically connected) to the eighth contact electrode ELT8.

Each of the contact electrodes ELT may be disposed in the first light emitting area EMA1 or the second light emitting area EMA2. The contact electrodes ELT may not overlap the non-light emitting area NEA. A distance between the contact electrodes ELT, e.g., a width of the non-light emitting area NEA in the second direction (e.g., Y-axis direction) may be about 5 μm or less, but embodiments are not limited thereto.

The contact electrodes ELT spaced apart from each other with the non-light emitting area NEA therebetween may be connected (e.g., electrically connected) through the connection electrodes CNE.

The contact electrodes ELT may overlap at least one electrode ALE and/or light emitting element LD. For example, each of the contact electrodes ELT may be provided on the electrodes ALE and/or the light emitting elements LD so as to overlap the electrodes ALE and/or the light emitting elements LD to be connected (e.g., electrically connected) to the light emitting elements LD.

The first contact electrode ELT1 may be disposed on the second electrode ALE2 and the first end portions EP1 of the first light emitting elements LD1 in the first light emitting area EMA1 to be connected (e.g., electrically connected) to the first end portions EP1 of the first light emitting elements LD1.

The second contact electrode ELT2 may be disposed on the first electrode ALE1 and the second end portions EP2 of the first light emitting elements LD1 in the first light emitting area EMA1 to be connected (e.g., electrically connected) to the second end portions EP2 of the first light emitting elements LD1.

The third contact electrode ELT3 may be disposed on the second electrode ALE2 and the first end portions EP1 of the second light emitting elements LD2 in the second light emitting area EMA2 to be connected (e.g., electrically connected) to the first end portions EP1 of the second light emitting elements LD2.

The fourth contact electrode ELT4 may be disposed on the first electrode ALE1 and the second end portions EP2 of the second light emitting elements LD2 in the second light emitting area EMA2 to be connected (e.g., electrically connected) to the second end portions EP2 of the second light emitting elements LD2.

The fifth contact electrode ELT5 may be disposed on the second electrode ALE2 and the first end portions EP1 of the third light emitting elements LD3 in the first light emitting area EMA1 to be connected (e.g., electrically connected) to the first end portions EP1 of the third light emitting elements LD3.

The sixth contact electrode ELT6 may be disposed on the third electrode ALE3 and the second end portions EP2 of the third light emitting elements LD3 in the first light emitting area EMA1 to be connected (e.g., electrically connected) to the second end portions EP2 of the third light emitting elements LD3.

The seventh contact electrode ELT7 may be disposed on the second electrode ALE2 and the first end portions EP1 of the fourth light emitting elements LD4 in the second light emitting area EMA2 to be connected (e.g., electrically connected) to the first end portions EP1 of the fourth light emitting elements LD4.

The eighth contact electrode ELT8 may be disposed on the third electrode ALE3 and the second end portions EP2 of the fourth light emitting elements LD4 in the second light emitting area EMA2 to be connected (e.g., electrically connected) to the second end portions EP2 of the fourth light emitting elements LD4.

The first contact electrode ELT1, the third contact electrode ELT3, the fifth contact electrode ELT5, and/or the seventh contact electrode ELT7 may be formed as the same conductive layer. The second contact electrode ELT2, the fourth contact electrode ELT4, the sixth contact electrode ELT6, and/or the eighth contact electrode ELT8 may be formed as the same conductive layer. For example, as shown in FIG. 5, the contact electrodes ELT may be formed as conductive layers. The first contact electrode ELT1, the third contact electrode ELT3, the fifth contact electrode ELT5, and/or the seventh contact electrode ELT7 may be formed as the first conductive layer, in case that the second contact electrode ELT2, the fourth contact electrode ELT4, the sixth contact electrode ELT6, and/or the eighth contact electrode ELT8 may be formed as a second conductive layer different from the first conductive layer. In another example, as shown in FIG. 6, the first to eighth contact electrodes ELT1, ELT2, ELT3, ELT4, ELT5, ELT6, ELT7, and ELT8 may be formed as the same conductive layer. As described above, in case that the first to eighth contact electrodes ELT1, ELT2, ELT3, ELT4, ELT5, ELT6, ELT7, and ELT8 are formed as the same conductive layer, the number of masks may be reduced and the manufacturing process may be simplified.

The contact electrodes ELT may be connected (e.g., electrically connected) through the connection electrode CNE. For example, the second contact electrode ELT2 and the third contact electrode ELT3 may be connected (e.g., electrically connected) through a first connection electrode CNE1. An end portion of the first connection electrode CNE1 may be connected (e.g., electrically connected) to the second contact electrode ELT2, and may bypass the first contact electrode ELT1 to be connected (e.g., electrically connected) to the third contact electrode ELT3. The first connection electrode CNE1 may overlap the non-light emitting area NEA. For example, the first connection electrode CNE1 may extend to cross (or intersect) the non-light emitting area NEA. The first connection electrode CNE1 and the third contact electrode ELT3, as shown in FIG. 5, may be formed as the same conductive layer. For example, the first connection electrode CNE1 may be connected (e.g., electrically connected) to the second contact electrode ELT2 through a contact hole, and may be integral (e.g., integrally formed) with the third contact electrode ELT3. In another example, as shown in FIG. 6, the first connection electrode CNE1, the second contact electrode ELT2, and the third contact electrode ELT3 may be formed as the same conductive layer. For example, the first connection electrode CNE1 may be integral (e.g., integrally formed) with the second contact electrode ELT2 and the third contact electrode ELT3.

The fourth contact electrode ELT4 and the fifth contact electrode ELT5 may be connected (e.g., electrically connected) through a second connection electrode CNE2. An end portion of the second connection electrode CNE2 may be connected (e.g., electrically connected) to the fourth contact electrode ELT4, and may bypass the third contact electrode ELT3 to be connected (e.g., electrically connected) to the fifth contact electrode ELT5. The second connection electrode CNE2 may overlap the non-light emitting area NEA, e.g., in a plan view. For example, the second connection electrode CNE2 may extend to cross (or intersect) the non-light emitting area NEA. The second connection electrode CNE2 and the fifth contact electrode ELT5, as shown in FIG. 5, may be formed as the same conductive layer. For example, the second connection electrode CNE2 may be connected (e.g., electrically connected) to the fourth contact electrode ELT4 through a contact hole, and may be integral (e.g., integrally formed) with the fifth contact electrode ELT5. In another example, as shown in FIG. 6, the second connection electrode CNE2, the fourth contact electrode ELT4, and the fifth contact electrode ELT5 may be formed as the same conductive layer. For example, the second connection electrode CNE2 may be integral (e.g., integrally formed) with the fourth contact electrode ELT4 and the fifth contact electrode ELT5.

The sixth contact electrode ELT6 and the seventh contact electrode ELT7 may be connected (e.g., electrically connected) through a third connection electrode CNE3. An end portion of the third connection electrode CNE3 may be connected (e.g., electrically connected) to the sixth contact electrode ELT6, and may bypass the eighth contact electrode ELT8 to be connected (e.g., electrically connected) to the seventh contact electrode ELT7. The third connection electrode CNE3 may overlap the non-light emitting area NEA, e.g., in a plan view. For example, the third connection electrode CNE3 may extend to cross (or intersect) the non-light emitting area NEA. The third connection electrode CNE3 and the seventh contact electrode ELT7, as shown in FIG. 5, may be formed as the same conductive layer. For example, the third connection electrode CNE3 may be connected (e.g., electrically connected) to the sixth contact electrode ELT6 through a contact hole, and may be integral (e.g., integrally formed) with the seventh contact electrode ELT7. In another example, as shown in FIG. 6, the third connection electrode CNE3, the sixth contact electrode ELT6, and the seventh contact electrode ELT7 may be formed as the same conductive layer. For example, the third connection electrode CNE3 may be integral (e.g., integrally formed) with the sixth contact electrode ELT6 and the seventh contact electrode ELT7.

In the above-described manner, the light emitting elements LD aligned between the electrodes ALE may be connected through the contact electrodes ELT and the connection electrodes CNE. For example, the first light emitting elements LD1, the second light emitting elements LD2, the third light emitting elements LD3, and the fourth light emitting elements LD4 may be sequentially connected in series through the contact electrodes ELT and the connection electrodes CNE. For example, by connecting (e.g., electrically connecting) the contact electrodes ELT through the connection electrode CNE bypassing the contact electrodes ELT, a structure in which the contact electrodes ELT are partially bent or curved in order to be connected to each other may be omitted. Accordingly, the non-light emitting area NEA in which the light emitting element LD is lost (or is not disposed) may be minimized.

Hereinafter, a cross-sectional structure of the pixel PXL will be described in detail with reference to FIG. 7 and FIG. 8. FIG. 7 and FIG. 8 illustrate the first transistor M1 among various circuit elements forming the pixel circuit (PXC in FIG. 4), and in case that it is not necessary to separately denote the first to third transistors M1, M2, and M3, they will be comprehensively referred to a "transistor M". For example, structures of the transistors M and/or a position of each layer thereof are not limited to the embodiments shown in FIG. 7 and FIG. 8, and may be variously changed according to embodiments.

The pixels PXL according to an embodiment may include circuit elements including the transistors M disposed on the base layer BSL and various wires connected thereto. The electrodes ALE, the light emitting elements LD, the contact electrodes ELT, the first bank BNK1, and/or the second bank BNK2 forming the light emitting part EMU may be disposed on the circuit elements.

The base layer BSL may form a base member, and may be a rigid or flexible substrate or film. For example, the base layer BSL may be a hard substrate made of glass or tempered glass, a flexible substrate (or a thin film) made of a plastic or metallic material, or at least one layered insulating layer. The material and/or physical properties of the base layer BSL are not limited thereto. In an embodiment, the base layer BSL may be substantially transparent. Here, the "substantially transparent" may mean that light may be transmitted at a certain transmittance or more. In another example, the base layer BSL may be translucent or opaque. In some embodiments, the base layer BSL may include a reflective material.

The lower conductive layer BML and a first power conductive layer PL2*a* may be disposed on the base layer BSL. The lower conductive layer BML and the first power conductive layer PL2*a* may be disposed on the same layer. For example, the lower conductive layer BML and the first power conductive layer PL2*a* may be simultaneously formed in the same process, but embodiments are not limited thereto. The first power conductive layer PL2*a* may form the second power line PL2 described with reference to FIG. 4 and the like.

Each of the lower conductive layer BML and the first power conductive layer PL2*a* may be formed as a single layer or a multilayer made of molybdenum (Mo), copper (Cu), aluminum (Al), chromium (Cr), gold (Au), titanium (Ti), nickel (Ni), neodymium (Nd), indium (In), tin (Sn), and an oxide thereof or an alloy thereof.

A buffer layer BFL may be disposed on the lower conductive layer BML and the first power conductive layer PL2*a*. The buffer layer BFL may prevent impurities from diffusing into the circuit element. The buffer layer BFL may be formed as a single layer, but may also be formed as a multilayer of at least double layers or more. In case that the buffer layer BFL is formed as the multilayer, respective layers may be made of the same material or different materials.

A semiconductor pattern layer SCP may be disposed on the buffer layer BFL. For example, the semiconductor pattern layer SCP may include a first area contacting a first transistor electrode TE1, a second area contacting a second transistor electrode TE2, and a channel area disposed between the first and second areas. In some embodiments, one of the first and second areas may be a source area, and another one thereof may be a drain area.

In some embodiments, the semiconductor pattern layer SCP may be made of polysilicon, amorphous silicon, an oxide semiconductor, or the like. The channel area of the semiconductor pattern layer SCP may be an intrinsic semiconductor as a semiconductor pattern layer that is not doped with impurities, and each of the first and second areas of the semiconductor pattern layer SCP may be a semiconductor doped with impurities.

A gate insulating layer GI may be disposed on the buffer layer BFL and the semiconductor pattern layer SCP. For example, the gate insulating layer GI may be disposed between the semiconductor pattern layer SCP and the gate electrode GE. The gate insulating layer GI may be disposed between the buffer layer BFL and a second power conductive layer PL2*b*. The gate insulating layer GI may be formed as a single layer or a multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

A gate electrode GE of the transistor M and the second power conductive layer PL2*b* may be disposed on the gate insulating layer GI. The gate electrode GE and the second power conductive layer PL2*b* may be disposed on the same layer. For example, the gate electrode GE and the second power conductive layer PL2*b* may be simultaneously formed in the same process, but embodiments are not limited thereto. The gate electrode GE may overlap the semiconductor pattern layer SCP in a third direction (e.g., Z-axis direction) on the gate insulating layer GI. The second power conductive layer PL2*b* may overlap the first power conductive layer PL2*a* on the gate insulating layer GI in the third direction (e.g., Z-axis direction). The second power conductive layer PL2*b* together with the first power conductive layer PL2*a* may form the second power line PL2 described with reference to FIG. 4 and the like.

Each of the gate electrode GE and the second power conductive layer PL2*b* may be formed as a single layer or a multilayer made of molybdenum (Mo), copper (Cu), aluminum (Al), chromium (Cr), gold (Au), titanium (Ti), nickel (Ni), neodymium (Nd), indium (In), tin (Sn), and an oxide thereof or an alloy thereof. For example, each of the gate electrode GE and the second power conductive layer PL2*b* may be formed as a multilayer in which titanium (Ti), copper (Cu), and/or an indium tin oxide (ITO) are sequentially or repeatedly stacked.

An interlayer insulating layer ILD may be disposed on the gate electrode GE and the second power conductive layer PL2*b*. For example, the interlayer insulating layer ILD may be disposed between the gate electrode GE and the first and second transistor electrodes TE1 and TE2. The interlayer insulating layer ILD may be disposed between the second power conductive layer PL2*b* and a third power conductive layer PL2*c*.

The interlayer insulating layer ILD may be formed as a single layer or a multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The first and second transistor electrodes TE1 and TE2 of the transistor M and a third power conductive layer PL2*c* may be disposed on the interlayer insulating layer ILD. The first and second transistor electrodes TE1 and TE2 and the third power conductive layer PL2*c* may be disposed on the same layer. For example, the first and second transistor electrodes TE1 and TE2 and the third power conductive layer PL2*c* may be simultaneously formed in the same process, but embodiments are not limited thereto.

The first and second transistor electrodes TE1 and TE2 may overlap the semiconductor pattern layer SCP in the third direction (e.g., Z-axis direction). The first and second transistor electrodes TE1 and TE2 may be connected (e.g., electrically connected) to the semiconductor pattern layer SCP. For example, the first transistor electrode TE1 may be connected (e.g., electrically connected) to the first area of the semiconductor pattern layer SCP through a contact hole penetrating (or passing through) the interlayer insulating layer ILD. The first transistor electrode TE1 may be connected (e.g., electrically connected) to the lower conductive layer BML through a contact hole penetrating (or passing through) the interlayer insulating layer ILD and the buffer layer BFL. The second transistor electrode TE2 may be connected (e.g., electrically connected) to the second area of the semiconductor pattern layer SCP through a contact hole penetrating (or passing through) the interlayer insulating layer ILD. In some embodiments, one of the first and second transistor electrodes TE1 and TE2 may be a source electrode, and another one thereof may be a drain electrode.

The third power conductive layer PL2*c* may overlap the first power conductive layer PL2*a* and/or the second power conductive layer PL2*b* in the third direction (e.g., Z-axis direction). The third power conductive layer PL2*c* may be connected (e.g., electrically connected) to the first power conductive layer PL2*a* and/or the second power conductive layer PL2*b*. For example, the third power conductive layer PL2*c* may be connected (e.g., electrically connected) to the first power conductive layer PL2*a* through a contact hole penetrating (or passing through) the interlayer insulating layer ILD and the buffer layer BFL. The third power conductive layer PL2*c* may be connected (e.g., electrically connected) to the second power conductive layer PL2*b* through a contact hole penetrating (or passing through) the interlayer insulating layer ILD. The third power conductive layer PL2*c* together with the first power conductive layer PL2*a* and/or the second power conductive layer PL2*b* may form the second power line PL2 described with reference to FIG. 4 and the like.

The first and second transistor electrodes TE1 and TE2 and the third power conductive layer PL2*c* may be formed as a single layer or a multilayer made of molybdenum (Mo), copper (Cu), aluminum (Al), chromium (Cr), gold (Au), titanium (Ti), nickel (Ni), neodymium (Nd), indium (In), tin (Sn), and an oxide thereof or an alloy thereof.

A passivation layer PSV may be disposed on the first and second transistor electrodes TE1 and TE2 and the third power conductive layer PL2*c*. The passivation layer PSV may be formed as a single layer or a multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

A via layer VIA may be disposed on the passivation layer PSV. The via layer VIA may be made of an organic material to flatten a lower step difference thereof. For example, the via layer VIA may include an organic material such as an acrylates resin, an epoxy resin, a phenolic resin, a polyamides resin, a polyimide resin, a polyesters resin, a polyphenylenesulfides resin, or a benzocyclobutene (BCB). However, embodiments are not limited thereto, and the via layer VIA may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

Walls (e.g., partition walls or definition walls) WL may be disposed on the via layer VIA. The walls WL may function to form a step so as to readily align the light emitting elements LD in the light emitting area EMA.

The walls WL may have various shapes according to embodiments. In an embodiment, the walls WL may have a shape protruding in the third direction (e.g., Z-axis direction) on the base layer BSL. The walls WP may be formed to have an inclined surface inclined at a certain angle with respect to the base layer BSL. However, embodiments are not limited thereto, and the walls WP may have a side wall having a curved surface or a step shape. For example, the walls WP may have a cross-section of a semicircular or semi-elliptical shape.

The walls WP may include at least one organic material and/or inorganic material. For example, the walls WP may include an organic material such as an acrylates resin, an epoxy resin, a phenolic resin, a polyamides resin, a polyimide resin, a polyesters resin, a polyphenylenesulfides resin, or a benzocyclobutene (BCB). However, embodiments are not limited thereto, and the walls WL may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The electrodes ALE may be disposed on the via layer VIA and the walls WL. The electrodes ALE may at least partially cover side surfaces and/or upper surfaces of the walls WL. The electrodes ALE disposed on the walls WL may have shapes corresponding to the walls WL. For example, the electrodes ALE disposed on the walls WL may include inclined surfaces or curved surfaces having shapes corresponding to the shapes of the walls WL. For example, the walls WL and the electrodes ALE may be reflective members and may reflect light emitted from the light emitting elements LD to guide it in the front surface direction of the pixel PXL, e.g., in the third direction (e.g., Z-axis direction), so that the light output efficiency of the display panel PNL may be improved.

The electrodes ALE may be spaced apart from each other. The electrodes ALE may be disposed on the same layer. For example, the electrodes ALE may be simultaneously formed in the same process, but embodiments are not limited thereto.

The electrodes ALE may receive an alignment signal in the alignment process/step of the light emitting elements LD. Accordingly, an electric field is formed between the electrodes ALE so that the light emitting elements LD provided to each pixel PXL may be aligned between the electrodes ALE.

The electrodes ALE may include at least one conductive material. For example, the electrodes ALE may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same; a conductive oxide such as an indium tin oxide (ITO), an indium zinc oxide (IZO), an indium tin zinc Oxide (ITZO), an aluminum zinc oxide (AZO), a gallium zinc oxide (GZO), a zinc tin oxide (ZTO), or a gallium tin oxide (GTO); and at least one conductive material among conductive polymers such as poly(3,4-ethylenedioxythiophene) (PEDOT), but embodiments are not limited thereto.

A first insulating layer INS1 may be disposed on the electrodes ALE. The first insulating layer INS1 may be formed as a single layer or a multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The first bank BNK1 may be disposed on the first insulating layer INS1. The first bank BNK1 may include an opening overlapping the light emitting area EMA. The opening of the first bank BNK1 may provide a space in which the light emitting elements LD may be provided in a step of supplying the light emitting elements LD to each of the pixels PXL. For example, a type and/or amount of light emitting element ink may be supplied to a space partitioned by the opening of the first bank BNK1.

The first bank BNK1 may include an organic material such as an acrylates resin, an epoxy resin, a phenolic resin, a polyamides resin, a polyimide resin, a polyesters resin, a polyphenylenesulfides resin, or a benzocyclobutene (BCB). However, embodiments are not limited thereto, and the first bank BNK1 may be formed as a single layer or a multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The light emitting elements LD may be disposed between the electrodes ALE. The light emitting elements LD may be provided within the opening of the first bank BNK1 to be disposed between the walls WL.

The light emitting elements LD may be prepared in a form dispersed in light emitting element ink, and may be supplied to each pixel PXL through an inkjet printing method and the like. For example, the light emitting elements LD may be dispersed in a volatile solvent to be provided in each pixel PXL. Subsequently, in case that an alignment signal is supplied to the electrodes ALE, an electric field may be formed between the electrodes ALE, so that the light emitting elements LD may be aligned between the electrodes ALE. After the light emitting elements LD are aligned, the light emitting elements LD may be stably arranged between the electrodes ALE by volatilizing the solvent or eliminating it in other ways.

A second insulating layer INS2 may be disposed on the light emitting elements LD. For example, the second insulating layer INS2 may be partially provided on the light emitting elements LD, and may expose the first and second end portions EP1 and EP2 of the light emitting elements LD. In case that the second insulating layer INS2 is provided on the light emitting elements LD after the alignment of the light emitting elements LD is completed, the light emitting elements LD may prevented from deviating from an aligned position.

The second insulating layer INS2 may be formed as a single layer or a multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The contact electrodes ELT may be disposed on the first and second end portions EP1 and EP2 of the light emitting elements LD exposed by the second insulating layer INS2. The first contact electrode ELT1 may be disposed (e.g., directly disposed) on the first end portions EP1 of the first light emitting elements LD1 to contact the first end portions EP1 of the first light emitting elements LD1. The second contact electrode ELT2 may be disposed (e.g., directly disposed) on the second end portions EP2 of the first light emitting elements LD1 to contact the second end portions EP2 of the first light emitting elements LD1. The third contact electrode ELT3 may be disposed (e.g., directly disposed) on the first end portions EP1 of the second light emitting elements LD2 to contact the first end portions EP1 of the second light emitting elements LD2. The fourth contact electrode ELT4 may be disposed (e.g., directly disposed) on the second end portions EP2 of the second light emitting elements LD2 to contact the second end portions EP2 of the second light emitting elements LD2. The fifth contact electrode ELT5 may be disposed (e.g., directly disposed) on the first end portions EP1 of the third light emitting elements LD3 to contact the first end portions EP1 of the third light emitting elements LD3. The sixth contact electrode ELT6 may be disposed (e.g., directly disposed) on the second end portions EP2 of the third light emitting elements LD3 to contact the second end portions EP2 of the third light emitting elements LD3. The seventh contact electrode ELT7 may be disposed (e.g., directly disposed) on the first end portions EP1 of the fourth light emitting elements LD4 to contact the first end portions EP1 of the fourth light emitting elements LD4. The eighth contact electrode ELT8 may be disposed (e.g., directly disposed) on the second end portions EP2 of the fourth light emitting elements LD4 to contact the second end portions EP2 of the fourth light emitting elements LD4.

In an embodiment, the contact electrodes ELT may be formed as conductive layers. For example, as shown in FIG. 5 and FIG. 7, the first contact electrode ELT1, the third contact electrode ELT3, the fifth contact electrode ELT5, and the seventh contact electrode ELT7 may be formed as a first conductive layer. The second contact electrode ELT2, the fourth contact electrode ELT4, the sixth contact electrode ELT6, and the eighth contact electrode ELT8 may be formed as a second conductive layer. The first conductive layer may be disposed on the second conductive layer. A third insulating layer INS3 may be disposed between the first conductive layer and the second conductive layer. As described above, in case that the third insulating layer INS3 is disposed between the contact electrodes ELT formed as different conductive layers, since the contact electrodes ELT may be stably separated by the third insulating layer INS3, electrical stability between the first and second end portions EP1 and EP2 of the light emitting elements LD may be ensured.

The third insulating layer INS3 may be formed as a single layer or a multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

In another example, the contact electrodes ELT may be formed as the same conductive layer. For example as shown in FIG. 6 and FIG. 8, the first to eighth contact electrodes ELT1, ELT2, ELT3, ELT4, ELT5, ELT6, ELT7, and ELT8 may be disposed on the same layer. For example, the contact electrodes ELT may be simultaneously formed in the same process. As described above, in case that the contact electrodes ELT are simultaneously formed, the number of masks may be reduced, and the manufacturing process may be simplified.

The contact electrodes ELT may be made of various transparent conductive materials. For example, the contact electrodes ELT may include at least one of various transparent conductive materials including an indium tin oxide (ITO), an indium zinc oxide (IZO), an indium tin zinc oxide (ITZO), an aluminum zinc oxide (AZO), a gallium zinc oxide (GZO), a zinc tin oxide (ZTO), and a gallium tin oxide (GTO), and may be implemented to be substantially transparent or translucent to satisfy a certain light transmittance. Accordingly, the light emitted from the first and second end portions EP1 and EP2 of the light emitting elements LD may pass through the contact electrodes ELT to be emitted to the outside of the display panel PNL.

In an embodiment, the connection electrodes CNE and contact electrodes ELT may be disposed on the same layer. For example, as shown in FIG. 5 and FIG. 7, in case that the contact electrodes ELT are formed as the first conductive layer and the second conductive layer, the connection electrodes CNE may be formed as the first conductive layer. However, embodiments are not limited thereto, and considering the connection relationship with the contact electrodes ELT, the connection electrodes CNE may be formed as the second conductive layer or the third conductive layer different from the first conductive layer and the second conductive layer. In another example, as shown in FIG. 6 and FIG. 8, in case that the contact electrodes ELT are formed as the same conductive layer, the connection electrodes CNE and the contact electrodes ELT may be formed as the same conductive layer. However, embodiments are not limited thereto, and considering the connection relationship with the contact electrodes ELT, the connection electrodes CNE may be formed as a different conductive layer from the contact electrodes ELT.

The second bank BNK2 may be disposed on the first bank BNK1. The second bank BNK2 may include an opening overlapping the light emitting area EMA. The opening of the second bank BNK2 may provide a space in which a color conversion layer to be described below may be provided. For example, a type and/or amount of the color conversion layer may be supplied to a space partitioned by the opening of the second bank BNK2.

Hereinafter, an embodiment will be described. The same elements as those described above will be referred to as the same reference numerals in embodiments below, and redundant descriptions will be omitted or simplified for descriptive convenience.

Figure 9:
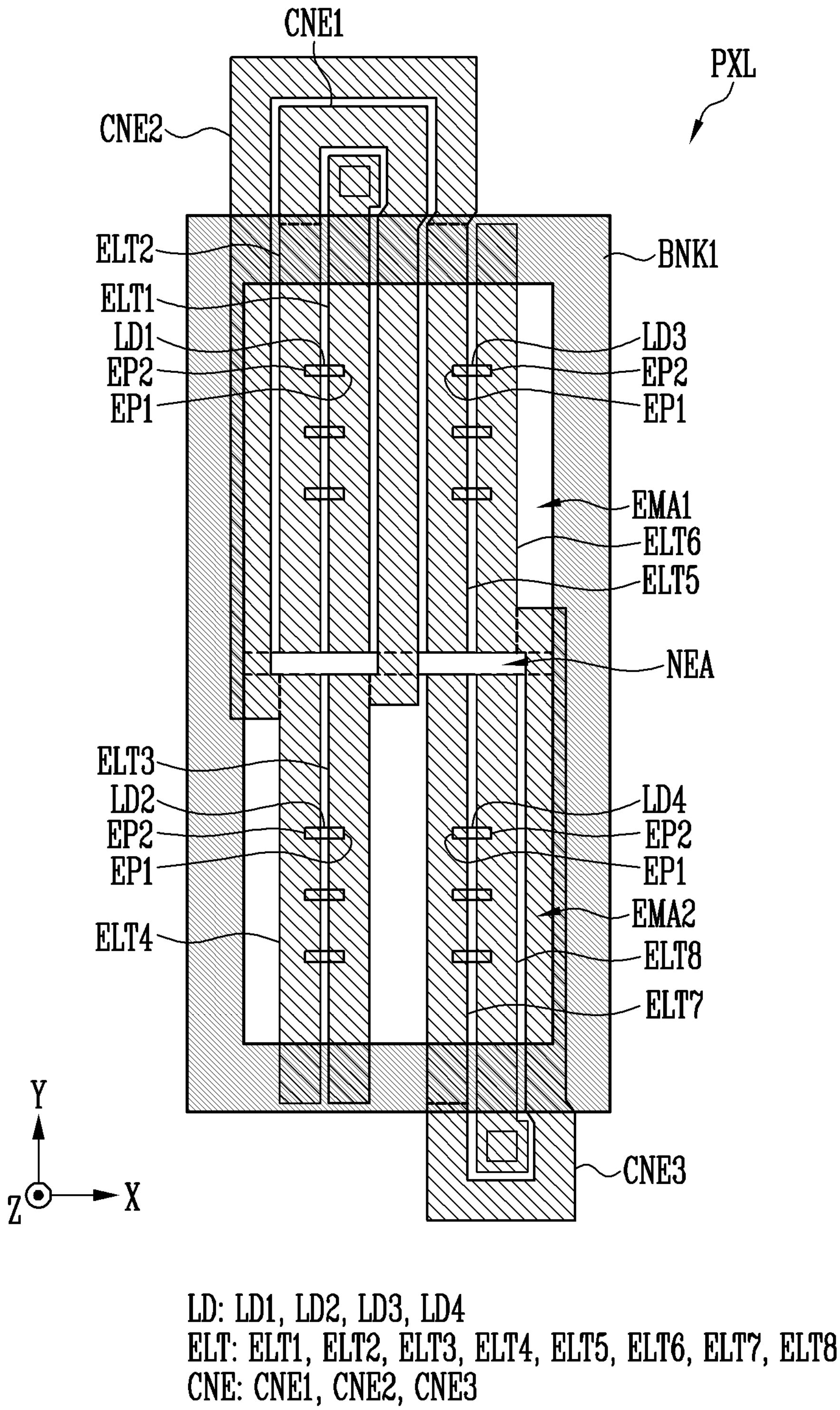
FIG. 9 and FIG. 10 illustrate schematic top plan views of a pixel according to an embodiment.
Figure 10:
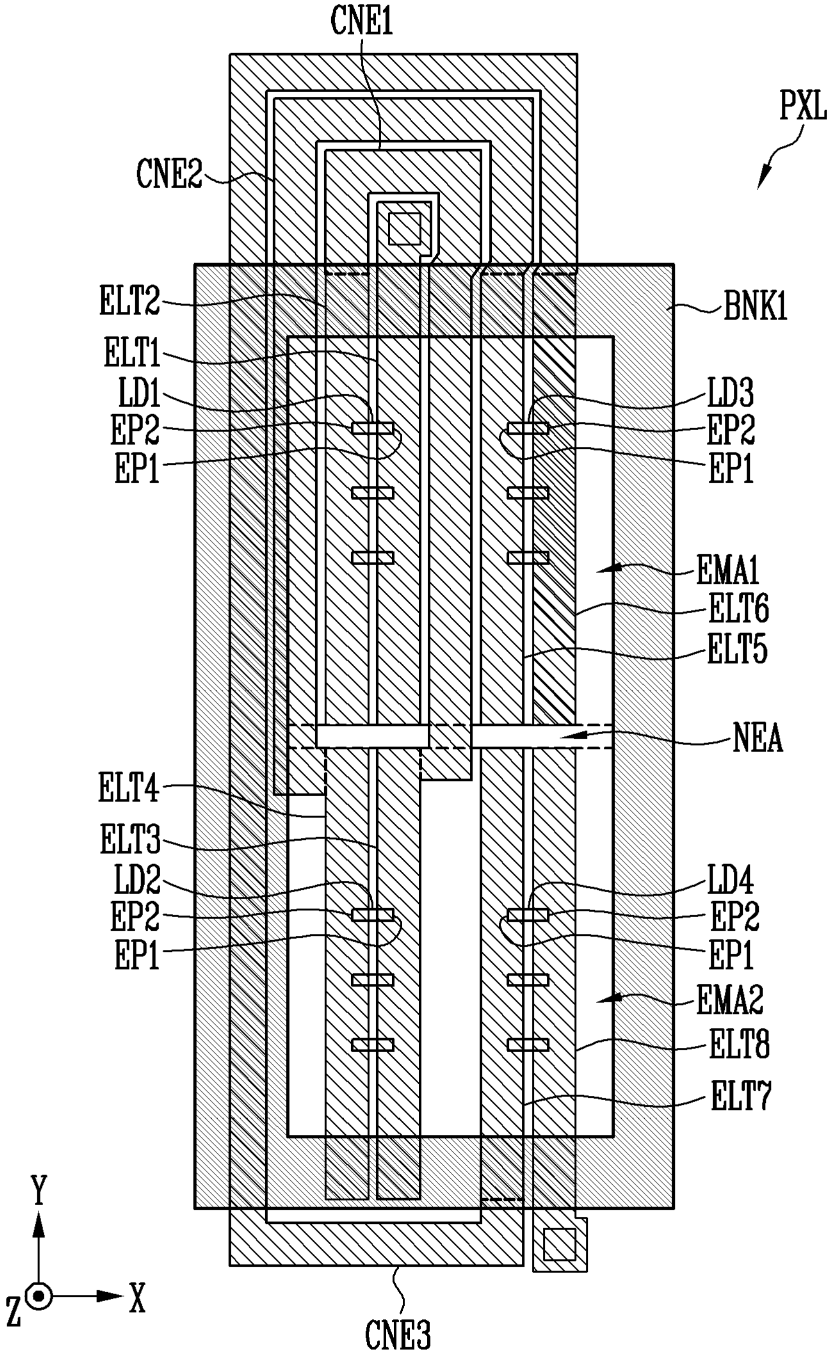

FIG. 9 and FIG. 10 illustrate schematic top plan views of a pixel according to an embodiment.

FIG. 9 and FIG. 10 illustrate the embodiment in which each pixel PXL includes the light emitting elements LD disposed in the four serial stages as shown in FIG. 4, but the number of serial stages of each pixel PXL may be variously changed according to embodiments. In FIG. 9 and FIG. 10, the electrodes ALE are omitted for descriptive convenience.

Referring to FIG. 9, the second contact electrode ELT2 and the third contact electrode ELT3 may be connected (e.g., electrically connected) through the first connection electrode CNE1. An end portion of the first connection electrode CNE1 may be connected (e.g., electrically connected) to the second contact electrode ELT2, and may bypass the first contact electrode ELT1 to be connected (e.g., electrically connected) to the third contact electrode ELT3. The first connection electrode CNE1 may overlap the non-light emitting area NEA, e.g., in a plan view. For example, the first connection electrode CNE1 may extend to cross (or intersect) the non-light emitting area NEA.

The fourth contact electrode ELT4 and the fifth contact electrode ELT5 may be connected (e.g., electrically connected) through a second connection electrode CNE2. An end portion of the second connection electrode CNE2 may be connected (e.g., electrically connected) to the fourth contact electrode ELT4, and may bypass the first contact electrode ELT1, the second contact electrode ELT2, and/or the first connection electrode CNE1 to be connected (e.g., electrically connected) to the fifth contact electrode ELT5. The second connection electrode CNE2 may overlap the non-light emitting area NEA, e.g., in a plan view. For example, the second connection electrode CNE2 may extend to cross (or intersect) the non-light emitting area NEA.

The sixth contact electrode ELT6 and the seventh contact electrode ELT7 may be connected (e.g., electrically connected) through the third connection electrode CNE3. An end portion of the third connection electrode CNE3 may be connected (e.g., electrically connected) to the sixth contact electrode ELT6, and may bypass the eighth contact electrode ELT8 to be connected (e.g., electrically connected) to the seventh contact electrode ELT7. The third connection electrode CNE3 may overlap the non-light emitting area NEA, e.g., in a plan view. For example, the third connection electrode CNE3 may extend to cross (or intersect) the non-light emitting area NEA. In FIG. 9, a case in which the connection electrodes CNE and the contact electrodes ELT are formed as the same layer is illustrated, but embodiments are not limited thereto.

By connecting (e.g., electrically connecting) the contact electrodes ELT through the connection electrode CNE that bypasses the contact electrodes ELT, since a structure in which the contact electrodes ELT are partially bent or curved in order to be connected to each other may be omitted, the resulting non-light emitting area NEA may be minimized as described above.

Referring to FIG. 10, the second contact electrode ELT2 and the third contact electrode ELT3 may be connected (e.g., electrically connected) through the first connection electrode CNE1. An end portion of the first connection electrode CNE1 may be connected (e.g., electrically connected) to the second contact electrode ELT2, and may bypass the first contact electrode ELT1 to be connected (e.g., electrically connected) to the third contact electrode ELT3. The first connection electrode CNE1 may overlap the non-light emitting area NEA, e.g., in a plan view. For example, the first connection electrode CNE1 may extend to cross (or intersect) the non-light emitting area NEA.

The fourth contact electrode ELT4 and the fifth contact electrode ELT5 may be connected (e.g., electrically connected) through the second connection electrode CNE2. An end portion of the second connection electrode CNE2 may be connected (e.g., electrically connected) to the fourth contact electrode ELT4, and may bypass the first contact electrode ELT1, the second contact electrode ELT2, and/or the first connection electrode CNE1 to be connected (e.g., electrically connected) to the fifth contact electrode ELT5. The second connection electrode CNE2 may overlap the non-light emitting area NEA, e.g., in a plan view. For example, the second connection electrode CNE2 may extend to cross (or intersect) the non-light emitting area NEA.

The sixth contact electrode ELT6 and the seventh contact electrode ELT7 may be connected (e.g., electrically connected) through the third connection electrode CNE3. The third connection electrode CNE3 may be connected (e.g., electrically connected) to the sixth contact electrode ELT6, and may bypass the first contact electrode ELT1, the second contact electrode ELT2, the third contact electrode ELT3, the fourth contact electrode ELT4, the fifth contact electrode ELT5, the first connection electrode CNE1, and/or the second connection electrode CNE2 to be connected (e.g., electrically connected) to the seventh contact electrode ELT7. The third connection electrode CNE3 may overlap the non-light emitting area NEA, e.g., in a plan view. For example, the third connection electrode CNE3 may extend to cross (or intersect) the non-light emitting area NEA. In FIG. 10, a case in which the connection electrodes CNE and the contact electrodes ELT are formed as the same layer is illustrated, but embodiments are not limited thereto.

By connecting (e.g., electrically connecting) the contact electrodes ELT through the connection electrode CNE that bypasses the contact electrodes ELT, since a structure in which the contact electrodes ELT are partially bent or curved in order to be connected to each other may be omitted, the resulting non-light emitting area NEA may be minimized as described above.

Figure 11:
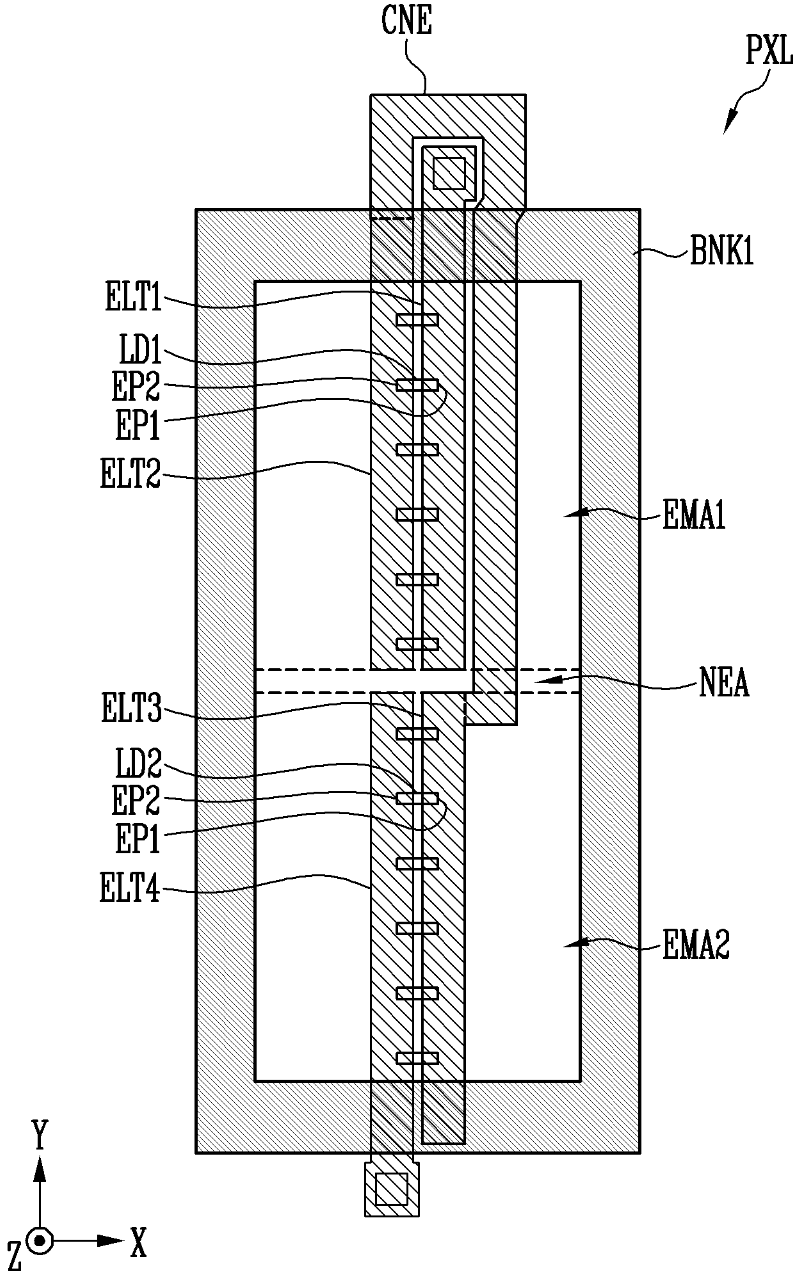
FIG. 11 and FIG. 12 illustrate schematic top plan views of a pixel according to an embodiment.
Figure 12:
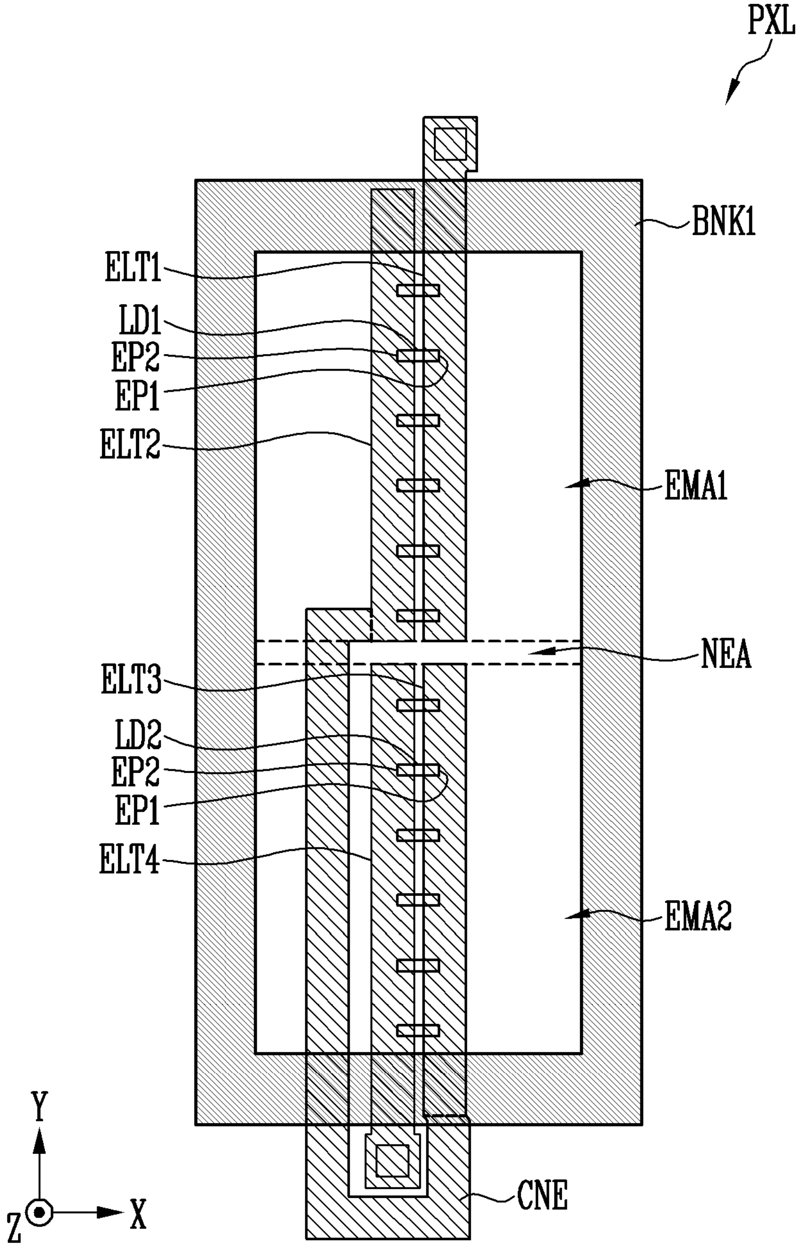

FIG. 11 and FIG. 12 illustrate schematic top plan views of a pixel according to an embodiment.

FIG. 11 and FIG. 12 illustrate the embodiment in which each pixel PXL includes the light emitting elements LD disposed in two serial stages, but the number of serial stages of each pixel PXL may be variously changed according to embodiments. In FIG. 11 and FIG. 12, the electrodes ALE are omitted for descriptive convenience.

Referring to FIG. 11 and FIG. 12, the pixel PXL may include the first light emitting area EMA1, the second light emitting area EMA2, and the non-light emitting area NEA, respectively. The non-light emitting area NEA may be disposed between the first light emitting area EMA1 and the second light emitting area EMA2. The first light emitting area EMA1 and the second light emitting area EMA2 may be a light emitting area including the light emitting elements LD. The first bank BNK1 may surround the first light emitting area EMA1 and the second light emitting area EMA2.

The first light emitting element LD1 may be disposed in the first light emitting area EMA1. The first light emitting element LD1 may be connected (e.g., electrically connected) between the first and second contact electrodes ELT1 and ELT2. For example, the first end portion EP1 of the first light emitting element LD1 may be connected (e.g., electrically connected) to the first contact electrode ELT1, and the second end portion EP2 of the first light emitting element LD1 may be connected (e.g., electrically connected) to the second contact electrode ELT2.

The second light emitting element LD2 may be disposed in the second light emitting area EMA2. The second light emitting element LD2 may be connected (e.g., electrically connected) between the third and fourth contact electrodes ELT3 and ELT4. For example, the first end portion EP1 of the second light emitting element LD2 may be connected (e.g., electrically connected) to the third contact electrode ELT3, and the second end portion EP2 of the second light emitting element LD2 may be connected (e.g., electrically connected) to the fourth contact electrode ELT4.

The first contact electrode ELT1 may be disposed on the first end portions EP1 of the first light emitting elements LD1 in the first light emitting area EMA1 to be connected (e.g., electrically connected) to the first end portions EP1 of the first light emitting elements LD1.

The second contact electrode ELT2 may be disposed on the second end portions EP2 of the first light emitting elements LD1 in the first light emitting area EMA1 to be connected (e.g., electrically connected) to the second end portions EP2 of the first light emitting elements LD1.

The third contact electrode ELT3 may be disposed on the first end portions EP1 of the second light emitting elements LD2 in the second light emitting area EMA2 to be connected (e.g., electrically connected) to the first end portions EP1 of the second light emitting elements LD2.

The fourth contact electrode ELT4 may be disposed on the second end portions EP2 of the second light emitting elements LD2 in the second light emitting area EMA2 to be connected (e.g., electrically connected) to the second end portions EP2 of the second light emitting elements LD2.

FIG. 11 and FIG. 12 illustrate the case in which the first to fourth contact electrodes ELT1, ELT2, ELT3, and ETL4 are formed as the same conductive layer, but embodiments are not limited thereto.

The second contact electrode ELT2 and the third contact electrode ELT3 may be connected (e.g., electrically connected) through the first connection electrode CNE1. As shown in FIG. 11, an end portion of the connection electrode CNE may be connected (e.g., electrically connected) to the second contact electrode ELT2, and may bypass the first contact electrode ELT1 to be connected (e.g., electrically connected) to the third contact electrode ELT3. In another example, as shown in FIG. 12, an end portion of the connection electrode CNE may be connected (e.g., electrically connected) to the second contact electrode ELT2, and may bypass the fourth contact electrode ELT4 to be connected (e.g., electrically connected) to the third contact electrode ELT3. The connection electrode CNE may overlap the non-light emitting area NEA, e.g., in a plan view. For example, the connection electrode CNE may extend to cross (or intersect) the non-light emitting area NEA. The connection electrode CNE and the contact electrodes ELT may be formed as the same conductive layer, but embodiments are not limited thereto.

In the above-described manner, the light emitting elements LD aligned between the electrodes ALE may be connected through the contact electrodes ELT and the connection electrodes CNE. For example, the first light emitting elements LD1 and the second light emitting elements LD2 may be connected in series through the contact electrodes ELT and the connection electrodes CNE. For example, by connecting (e.g., electrically connecting) the contact electrodes ELT through the connection electrode CNE that bypasses the contact electrodes ELT, since a structure in which the contact electrodes ELT are partially bent or curved in order to be connected to each other may be omitted, the resulting non-light emitting area NEA may be minimized as described above.

FIG. 13 to FIG. 17 illustrate schematic top plan views of a pixel according to an embodiment.

Figure 13:
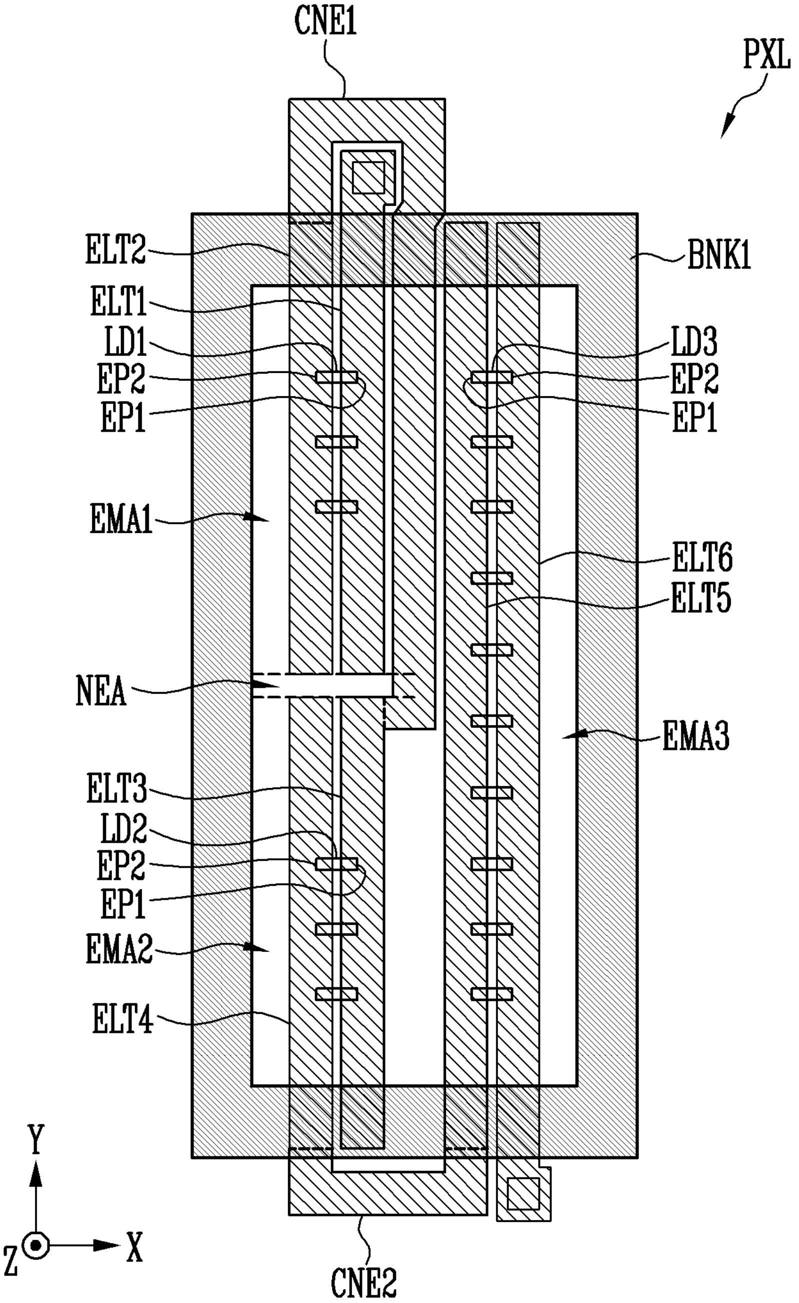
FIG. 13 to FIG. 17 illustrate schematic top plan views of a pixel according to an embodiment.
Figure 16:
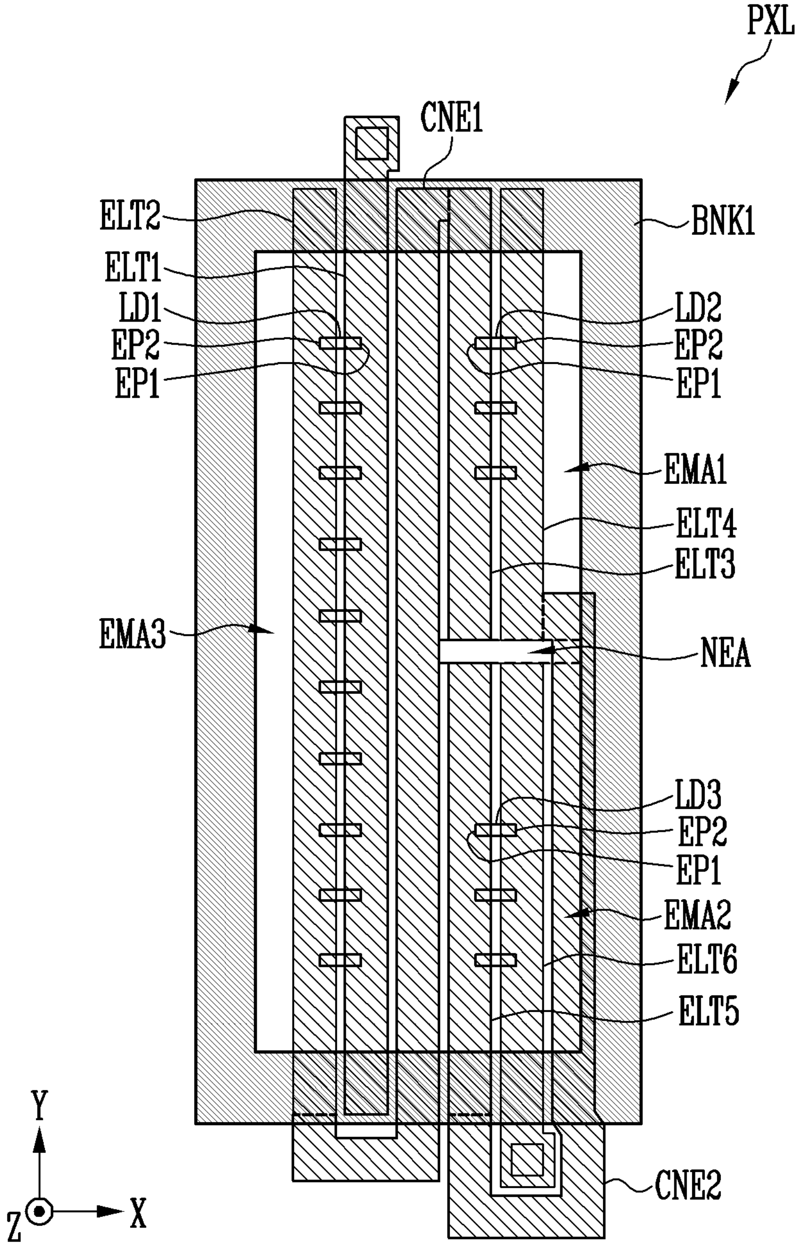
Figure 17:
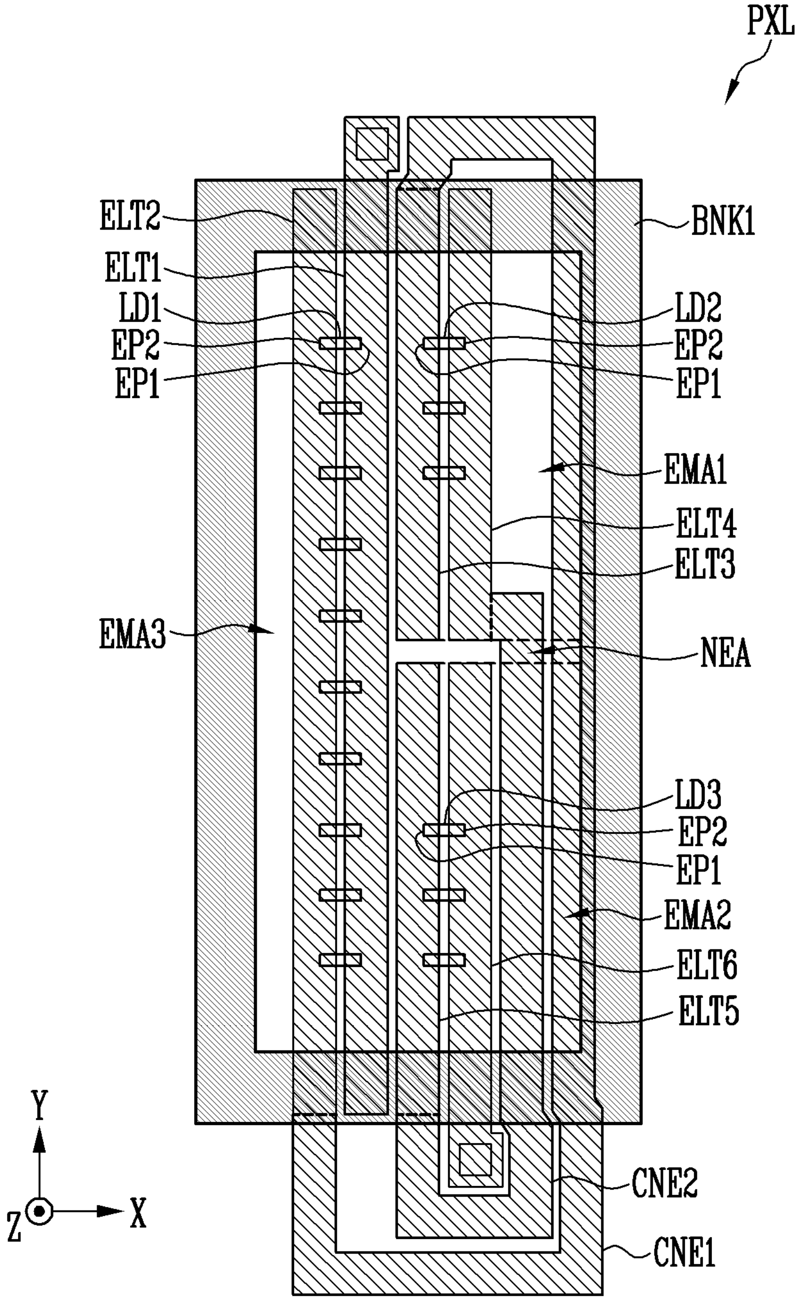

FIG. 13 and FIG. 17 illustrate the embodiment in which each pixel PXL includes the light emitting elements LD disposed in three serial stages, but the number of serial stages of each pixel PXL may be variously changed according to embodiments. In FIG. 13 to FIG. 17, the electrodes ALE are omitted for descriptive convenience.

Figure 14:
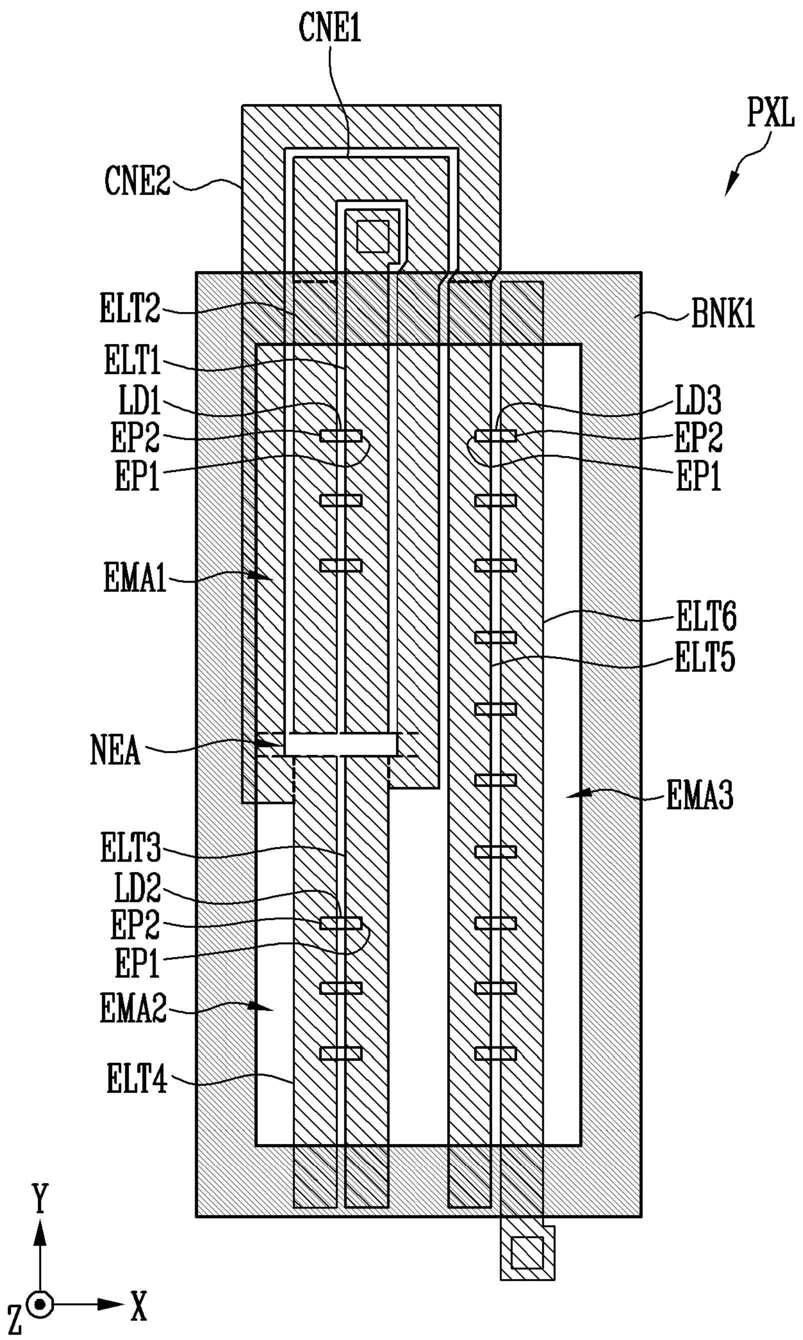

Referring to FIG. 13 and FIG. 14, the pixel PXL may include the first light emitting area EMA1, the second light emitting area EMA2, the third light emitting area EMA3, and the non-light emitting area NEA, respectively. The non-light emitting area NEA may be disposed between the first light emitting area EMA1 and the second light emitting area EMA2. The first light emitting area EMA1 and the second light emitting area EMA2 may be adjacent to each other in the second direction (e.g., Y-axis direction). The third light emitting area EMA3 may be adjacent to the first light emitting area EMA1 and the second light emitting area EMA2 in the first direction (e.g., X-axis direction).

The first to third light emitting areas EMA1, EMA2, and EMA3 may be areas that emit light by including light emitting elements LD. The first bank BNK1 may surround the first to third light emitting areas EMA1, EMA2, and EMA3.

The first light emitting element LD1 may be disposed in the first light emitting area EMA1. The first light emitting element LD1 may be connected (e.g., electrically connected) between the first and second contact electrodes ELT1 and ELT2. For example, the first end portion EP1 of the first light emitting element LD1 may be connected (e.g., electrically connected) to the first contact electrode ELT1, and the second end portion EP2 of the first light emitting element LD1 may be connected (e.g., electrically connected) to the second contact electrode ELT2.

The second light emitting element LD2 may be disposed in the second light emitting area EMA2. The second light emitting element LD2 may be connected (e.g., electrically connected) between the third and fourth contact electrodes ELT3 and ELT4. For example, the first end portion EP1 of the second light emitting element LD2 may be connected (e.g., electrically connected) to the third contact electrode ELT3, and the second end portion EP2 of the second light emitting element LD2 may be connected (e.g., electrically connected) to the fourth contact electrode ELT4.

The third light emitting element LD3 may be disposed in the third light emitting area EMA3. The third light emitting element LD3 may be connected (e.g., electrically connected) between the fifth and sixth contact electrodes ELT5 and ELT6. For example, the first end portion EP1 of the third light emitting element LD3 may be connected (e.g., electrically connected) to the fifth contact electrode ELT5, and the second end portion EP2 of the third light emitting element LD3 may be connected (e.g., electrically connected) to the sixth contact electrode ELT6.

The first contact electrode ELT1 may be disposed on the first end portions EP1 of the first light emitting elements LD1 in the first light emitting area EMA1 to be connected (e.g., electrically connected) to the first end portions EP1 of the first light emitting elements LD1.

The second contact electrode ELT2 may be disposed on the second end portions EP2 of the first light emitting elements LD1 in the first light emitting area EMA1 to be connected (e.g., electrically connected) to the second end portions EP2 of the first light emitting elements LD1.

The third contact electrode ELT3 may be disposed on the first end portions EP1 of the second light emitting elements LD2 in the second light emitting area EMA2 to be connected (e.g., electrically connected) to the first end portions EP1 of the second light emitting elements LD2.

The fourth contact electrode ELT4 may be disposed on the second end portions EP2 of the second light emitting elements LD2 in the second light emitting area EMA2 to be connected (e.g., electrically connected) to the second end portions EP2 of the second light emitting elements LD2.

The fifth contact electrode ELT5 may be disposed on the first end portions EP1 of the third light emitting elements LD3 in the third light emitting area EMA3 to be connected (e.g., electrically connected) to the first end portions EP1 of the third light emitting elements LD3.

The sixth contact electrode ELT6 may be disposed on the second end portions EP2 of the third light emitting elements LD3 in the third light emitting area EMA3 to be connected (e.g., electrically connected) to the second end portions EP2 of the third light emitting elements LD3.

FIG. 13 and FIG. 14 illustrate the case in which the first to sixth contact electrodes ELT1, ELT2, ELT3, ETL4, ELT5, and ELT6 are formed as the same conductive layer, but embodiments are not limited thereto.

The contact electrodes ELT may be connected (e.g., electrically connected) through the connection electrode CNE. For example, the second contact electrode ELT2 and the third contact electrode ELT3 may be connected (e.g., electrically connected) through the first connection electrode CNE1. An end portion of the first connection electrode CNE1 may be connected (e.g., electrically connected) to the second contact electrode ELT2, and may bypass the first contact electrode ELT1 to be connected (e.g., electrically connected) to the third contact electrode ELT3.

The fourth contact electrode ELT4 and the fifth contact electrode ELT5 may be connected (e.g., electrically connected) through the second connection electrode CNE2. As shown in FIG. 13, an end portion of the second connection electrode CNE2 may be connected (e.g., electrically connected) to the fourth contact electrode ELT4, and may bypass the third contact electrode ELT3 to be connected (e.g., electrically connected) to the fifth contact electrode ELT5. In another example, as shown in FIG. 14, an end portion of the second connection electrode CNE2 may be connected (e.g., electrically connected) to the fourth contact electrode ELT4, and may bypass the first contact electrode ELT1, the second contact electrode ELT2, and/or the first connection electrode CNE1 to be connected (e.g., electrically connected) to the fifth contact electrode ELT5. The connection electrode CNE and the contact electrodes ELT may be formed as the same conductive layer, but embodiments are not limited thereto.

In the above-described manner, the light emitting elements LD aligned between the electrodes ALE may be connected through the contact electrodes ELT and the connection electrodes CNE. For example, the first light emitting elements LD1, the second light emitting elements LD2, and the third light emitting elements LD3 may be sequentially connected in series through the contact electrodes ELT and the connection electrodes CNE. For example, by connecting (e.g., electrically connecting) the contact electrodes ELT through the connection electrode CNE that bypasses the contact electrodes ELT, since a structure in which the contact electrodes ELT are partially bent or curved in order to be connected to each other may be omitted, the resulting non-light emitting area NEA may be minimized as described above.

Figure 15:
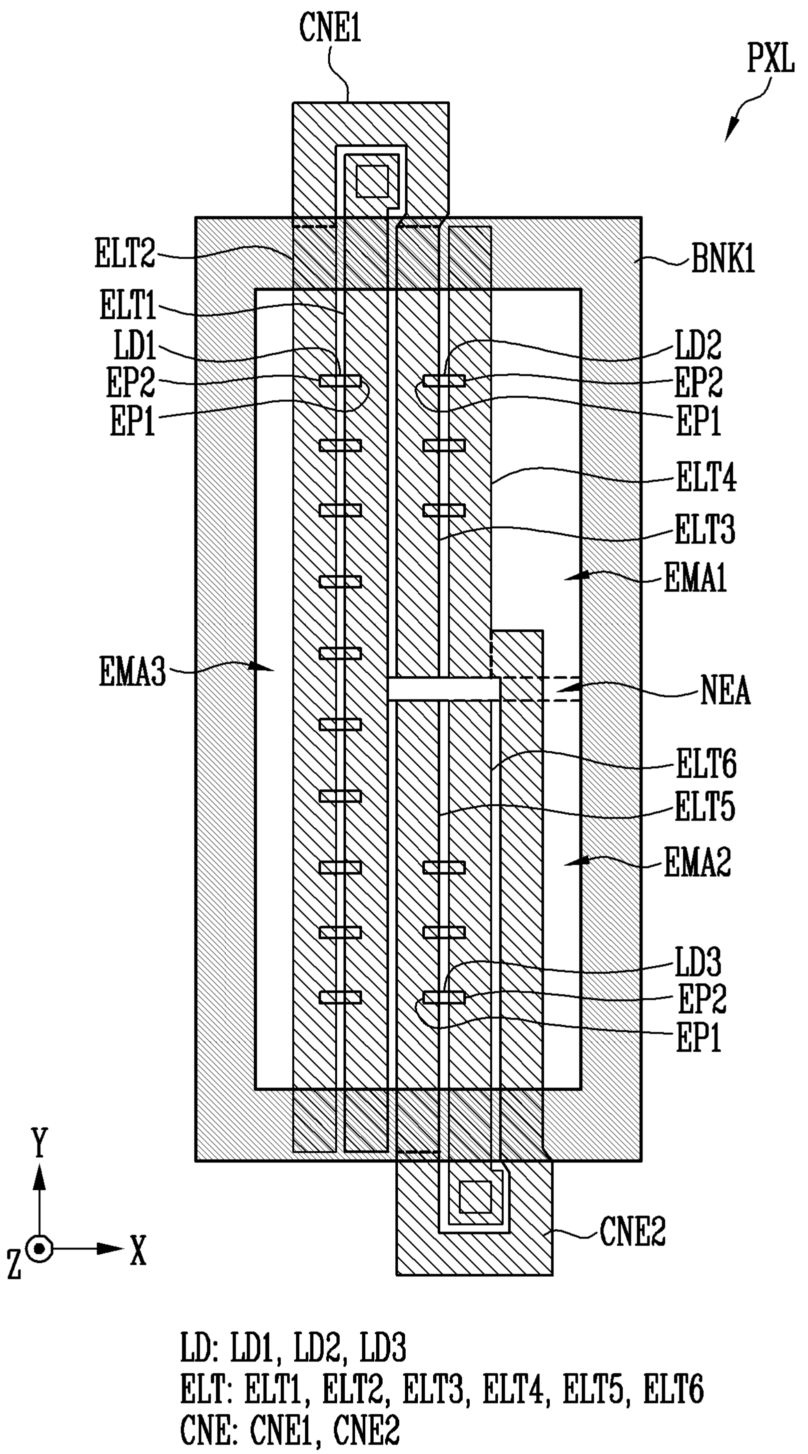

Referring to FIG. 15 to FIG. 17, each pixel PXL may include the first light emitting area EMA1, the second light emitting area EMA2, the third light emitting area EMA3, and the non-light emitting area NEA. The non-light emitting area NEA may be disposed between the first light emitting area EMA1 and the second light emitting area EMA2. The first light emitting area EMA1 and the second light emitting area EMA2 may be adjacent to each other in the second direction (e.g., Y-axis direction). The third light emitting area EMA3 may be adjacent to the first light emitting area EMA1 and the second light emitting area EMA2 in the first direction (e.g., X-axis direction).

The first to third light emitting areas EMA1, EMA2, and EMA3 may be areas that emit light by including light emitting elements LD. The first bank BNK1 may surround the first to third light emitting areas EMA1, EMA2, and EMA3.

The first light emitting element LD1 may be disposed in the third light emitting area EMA3. The first light emitting element LD1 may be connected (e.g., electrically connected) between the first and second contact electrodes ELT1 and ELT2. For example, the first end portion EP1 of the first light emitting element LD1 may be connected (e.g., electrically connected) to the first contact electrode ELT1, and the second end portion EP2 of the first light emitting element LD1 may be connected (e.g., electrically connected) to the second contact electrode ELT2.

The second light emitting element LD2 may be disposed in the first light emitting area EMA1. The second light emitting element LD2 may be connected (e.g., electrically connected) between the third and fourth contact electrodes ELT3 and ELT4. For example, the first end portion EP1 of the second light emitting element LD2 may be connected (e.g., electrically connected) to the third contact electrode ELT3, and the second end portion EP2 of the second light emitting element LD2 may be connected (e.g., electrically connected) to the fourth contact electrode ELT4.

The third light emitting element LD3 may be disposed in the second light emitting area EMA2. The third light emitting element LD3 may be connected (e.g., electrically connected) between the fifth and sixth contact electrodes ELT5 and ELT6. For example, the first end portion EP1 of the third light emitting element LD3 may be connected (e.g., electrically connected) to the fifth contact electrode ELT5, and the second end portion EP2 of the third light emitting element LD3 may be connected (e.g., electrically connected) to the sixth contact electrode ELT6.

The first contact electrode ELT1 may be disposed on the first end portions EP1 of the first light emitting elements LD1 in the third light emitting area EMA3 to be connected (e.g., electrically connected) to the first end portions EP1 of the first light emitting elements LD1.

The second contact electrode ELT2 may be disposed on the second end portions EP2 of the first light emitting elements LD1 in the third light emitting area EMA3 to be connected (e.g., electrically connected) to the second end portions EP2 of the first light emitting elements LD1.

The third contact electrode ELT3 may be disposed on the first end portions EP1 of the second light emitting elements LD2 in the first light emitting area EMA1 to be connected (e.g., electrically connected) to the first end portions EP1 of the second light emitting elements LD2.

The fourth contact electrode ELT4 may be disposed on the second end portions EP2 of the second light emitting elements LD2 in the first light emitting area EMA1 to be connected (e.g., electrically connected) to the second end portions EP2 of the second light emitting elements LD2.

The fifth contact electrode ELT5 may be disposed on the first end portions EP1 of the third light emitting elements LD3 in the second light emitting area EMA2 to be connected (e.g., electrically connected) to the first end portions EP1 of the third light emitting elements LD3.

The sixth contact electrode ELT6 may be disposed on the second end portions EP2 of the third light emitting elements LD3 in the second light emitting area EMA2 to be connected (e.g., electrically connected) to the second end portions EP2 of the third light emitting elements LD3.

FIG. 15 to FIG. 17 illustrate the case in which the first to sixth contact electrodes ELT1, ELT2, ELT3, ETL4, ELT5, and ELT6 are formed as the same conductive layer, but embodiments are not limited thereto.

The contact electrodes ELT may be connected (e.g., electrically connected) through the connection electrode CNE. For example, the second contact electrode ELT2 and the third contact electrode ELT3 may be connected (e.g., electrically connected) through the first connection electrode CNE1. As shown in FIG. 15, an end portion of the first connection electrode CNE1 may be connected (e.g., electrically connected) to the first connected to the second contact electrode ELT2, and may bypass an end portion of the first contact electrode ELT1 to be connected (e.g., electrically connected) to the third contact electrode ELT3. In another example, as shown in FIG. 16, an end portion of the first connection electrode CNE1 may be connected (e.g., electrically connected) to the first connected to the second contact electrode ELT2, and may bypass another end portion of the first contact electrode ELT1 to be connected (e.g., electrically connected) to the third contact electrode ELT3. In another example, as shown in FIG. 17, an end portion of the first connection electrode CNE1 may be connected (e.g., electrically connected) to the second contact electrode ELT2, and may bypass the first contact electrode ELT1, the fourth contact electrode ELT4, the fifth contact electrode ELT5, the sixth contact electrode ELT6, and/or the second connection electrode CNE2 to be connected (e.g., electrically connected) to the third contact electrode ELT3.

The fourth contact electrode ELT4 and the fifth contact electrode ELT5 may be connected (e.g., electrically connected) through the second connection electrode CNE2. An end portion of the second connection electrode CNE2 may be connected (e.g., electrically connected) to the fourth contact electrode ELT4, and may bypass the sixth contact electrode ELT6 to be connected (e.g., electrically connected) to the fifth contact electrode ELT5. The connection electrode CNE and the contact electrodes ELT may be formed as the same conductive layer, but embodiments are not limited thereto.

In the above-described manner, the light emitting elements LD aligned between the electrodes ALE may be connected through the contact electrodes ELT and the connection electrodes CNE. For example, the first light emitting elements LD1, the second light emitting elements LD2, and the third light emitting elements LD3 may be sequentially connected in series through the contact electrodes ELT and the connection electrodes CNE. For example, by connecting (e.g., electrically connecting) the contact electrodes ELT through the connection electrode CNE that bypasses the contact electrodes ELT, since a structure in which the contact electrodes ELT are partially bent or curved in order to be connected to each other may be omitted, the resulting non-light emitting area NEA may be minimized as described above.

Figure 18:
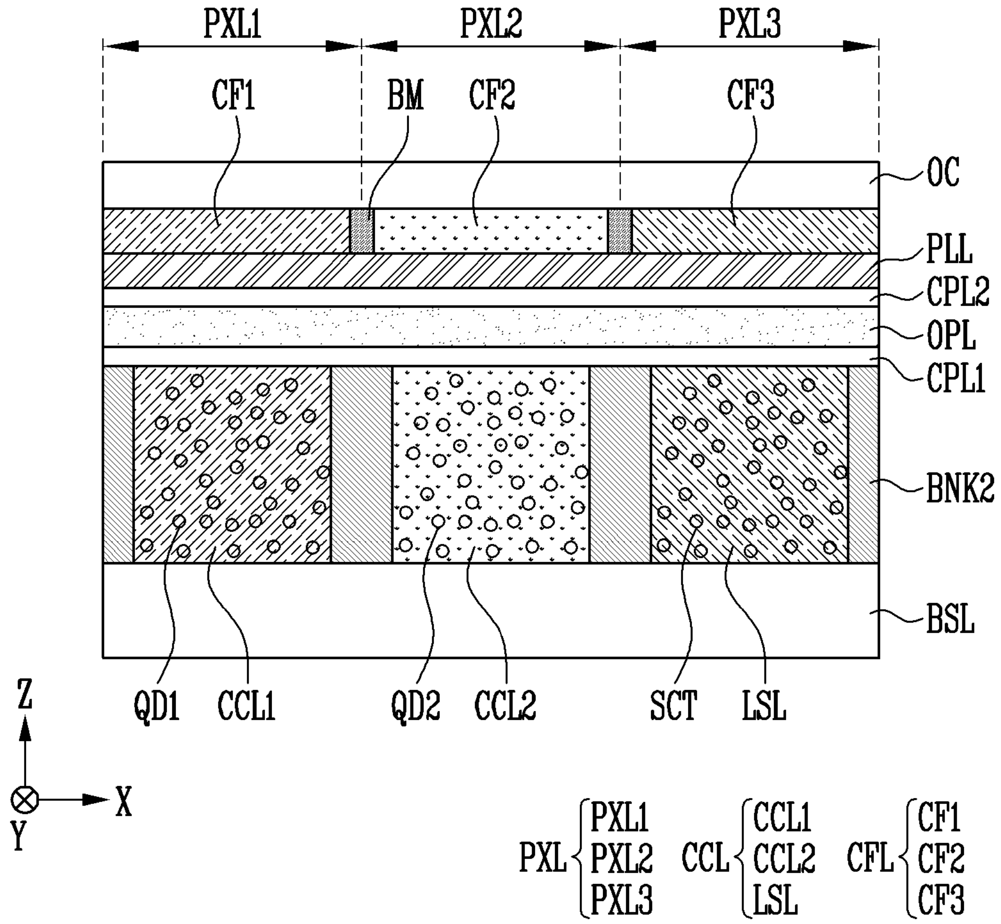
FIG. 18 illustrates a schematic cross-sectional view of first to third pixels according to an embodiment.
Figure 19:
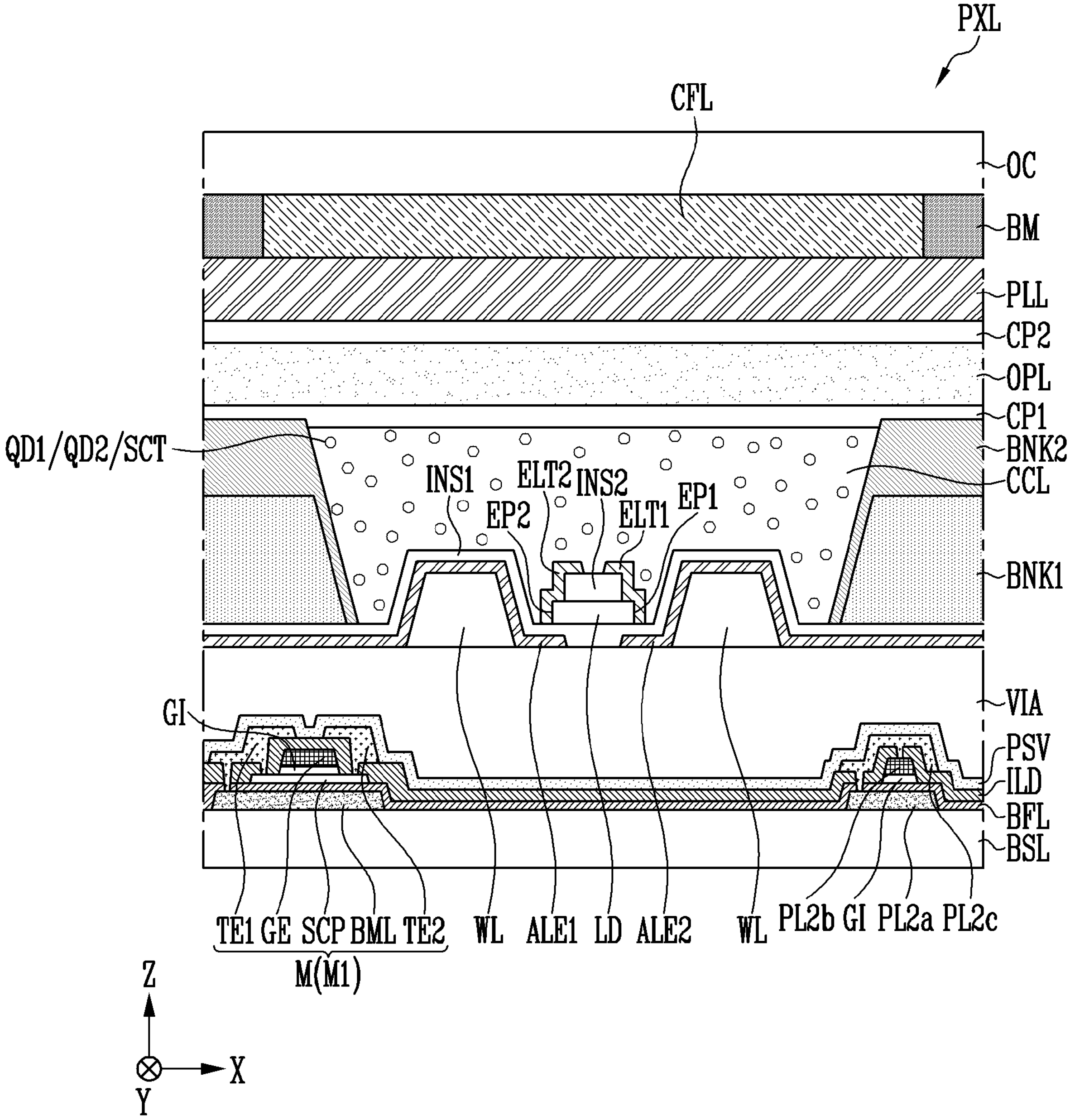
FIG. 19 illustrates a schematic cross-sectional view of a pixel according to an embodiment.

FIG. 18 illustrates a schematic cross-sectional view of first to third pixels according to an embodiment. FIG. 19 illustrates a schematic cross-sectional view of a pixel according to an embodiment.

FIG. 18 illustrates a color conversion layer CCL, an optical layer OPL, a color filter layer CFL, and/or a light blocking layer BM. In FIG. 18, components except for the base layer BSL and the second bank BNK2 of FIG. 7 and FIG. 8 are omitted for descriptive convenience. FIG. 19 illustrates a stacked structure of the pixel PXL in relation to the color conversion layer CCL, the optical layer OPL, and/or the color filter layer CFL.

Referring to FIG. 18 and FIG. 19, the second bank BNK2 may be disposed between the first to third pixels PXL1, PXL2, and PXL3 or at a boundary thereof, and may include an opening respectively overlapping the first to third pixels PXL1, PXL2, and PXL3. The opening of the second bank BNK2 may provide a space in which the color conversion layer CCL may be provided.

The second bank BNK2 may include an organic material such as an acrylates resin, an epoxy resin, a phenolic resin, a polyamides resin, a polyimide resin, a polyesters resin, a polyphenylenesulfides resin, a polypropylene (PP), a polytetrafluoroethylene (PTFE), or a benzocyclobutene (BCB).

The color conversion layer CCL may be disposed on the light emitting elements LD in an opening of the second bank BNK2. The color conversion layer CCL may include a first color conversion layer CCL1 disposed on the first pixel PXL1, a second color conversion layer CCL2 disposed on the second pixel PXL2, and a scattering layer LSL disposed on the third pixel PXL3.

In an embodiment, the first to third pixels PXL1, PXL2, and PXL3 may include the light emitting elements LD that emit light of the same color. For example, the first to third pixels PXL1, PXL2, and PXL3 may include the light emitting elements LD that emit light of a third color (e.g., blue color). The color conversion layer CCL including color conversion particles may be disposed on the first to third pixels PXL1, PXL2, and PXL3, respectively, thereby displaying a full-color image.

The first color conversion layer CCL1 may include first color conversion particles that convert light of the third color emitted from the light emitting element LD into light of the first color. For example, the first color conversion layer CCL1 may include first quantum dots QD1 dispersed in a matrix material such as a base resin.

In an embodiment, in case that the light emitting element LD is a blue light emitting element that emits blue light and the first pixel PXL1 is a red pixel, the first color conversion layer CCL1 may include a first quantum dot QD1 that converts blue light emitted from the blue light emitting element into red light. The first quantum dot QD1 may absorb blue light to shift a wavelength according to an energy transition to emit red light. For example, in case that the first pixel PXL1 is a pixel of a different color, the first color conversion layer CCL1 may include a first quantum dot QD1 corresponding to a color of the first pixel PXL1.

The second color conversion layer CCL2 may include second color conversion particles that convert light of the third color emitted from the light emitting element LD into light of the second color. For example, the second color conversion layer CCL2 may include second quantum dots QD2 dispersed in a matrix material such as a base resin.

In an embodiment, in case that the light emitting element LD is a blue light emitting element that emits blue light and the second pixel PXL2 is a green pixel, the second color conversion layer CCL2 may include a second quantum dot QD2 that converts blue light emitted from the blue light emitting element into green light. The second quantum dot QD2 may absorb blue light to shift a wavelength according to an energy transition to emit green light. In case that the second pixel PXL2 is a pixel of a different color, the second color conversion layer CCL2 may include the second quantum dot QD2 corresponding to a color of the second pixel PXL2.

In an embodiment, blue light having a relatively short wavelength among the visible ray bands may be incident on the first quantum dot QD1 and the second quantum dot QD2, respectively, thereby increasing absorption coefficient of of the first quantum dot QD1 and the second quantum dot QD2. Accordingly, the efficiency of light emitted from the first pixel PXL1 and the second pixel PXL2 may be finally increased, and at the same time, the excellent color reproducibility may be secured. The light emitting part EMU of the first to third pixels PXL1, PXL2, and PXL3 may be formed by using the light emitting elements LD of the same color (for example, the blue color light emitting element), thereby increasing the manufacturing efficiency of the display device.

The scattering layer LSL may be provided to efficiently use the third color (e.g., blue color) light emitted from the light emitting element LD. For example, in case that the light emitting element LD is a blue light emitting element that emits blue light and the third pixel PXL3 is a blue pixel, the scattering layer LSL may include at least one type of scatterer SCT to efficiently use the light emitted from the light emitting element LD. For example, the scatterer SCT of the scattering layer LSL may include at least one of a titanium oxide ($TiO_2$), a barium sulfate ($BaSO_4$), a calcium carbonate ($CaCO_3$), a silicon oxide ($SiO_2$), a silicon nitride ($Si_3N_4$), an aluminum oxide ($Al_2O_3$), a zirconium oxide ($ZrO_2$), and a zinc oxide (ZnO). For example, the scatterer SCT may not be disposed only in the third pixel PXL3, and may be selectively included in the first color conversion layer CCL1 or the second color conversion layer CCL2. In some embodiments, the scatterer SCT may be omitted to provide the scattering layer LSL made of a transparent polymer.

A first capping layer CPL1 may be disposed on the color conversion layer CCL. The first capping layer CPL1 may be disposed (e.g., entirely disposed) on the first to third pixels PXL1, PXL2, and PXL3. The first capping layer CPL1 may cover the color conversion layer CCL. The first capping layer CPL1 may prevent impurities such as moisture or air from penetrating (or permeating) from the outside to damage or contaminate the color conversion layer CCL.

The first capping layer CPL1 may be an inorganic layer, which includes a silicon nitride ($SiN_x$), an aluminum nitride ($AlN_x$), a titanium nitride ($TiN_x$), a silicon oxide ($SiO_x$), an aluminum oxide ($AlO_x$), a titanium oxide ($TiO_x$), a silicon oxycarbide ($SiO_xC_y$), or a silicon oxynitride ($SiO_xN_y$).

The optical layer OPL may be disposed on the first capping layer CPL1. The optical layer OPL may function to improve light extraction efficiency by recycling light provided from the color conversion layer CCL by total reflection. For example, the optical layer OPL may have a relatively low refractive index as compared to the color conversion layer CCL. For example, the refractive index of the color conversion layer CCL may be about 1.6 to about 2.0, and the refractive index of the optical layer OPL may be about 1.1 to about 1.3.

A second capping layer CPL2 may be disposed on the optical layer OPL. The second capping layer CPL2 may be disposed (e.g., entirely disposed) on the first to third pixels PXL1, PXL2, and PXL3. The second capping layer CPL2 may cover the optical layer OPL. The second capping layer CPL2 may prevent impurities such as moisture or air from penetrating (or permeating) from the outside to damage or contaminate the optical layer OPL.

The second capping layer CPL2 may be an inorganic layer, which includes a silicon nitride ($SiN_x$), an aluminum nitride ($AlN_x$), a titanium nitride ($TiN_x$), a silicon oxide ($SiO_x$), an aluminum oxide ($AlO_x$), a titanium oxide ($TiO_x$), a silicon oxycarbide ($SiO_xC_y$), or a silicon oxynitride ($SiO_xN_y$).

A planarization layer PLL may be disposed on the second capping layer CPL2. The planarization layer PLL may be provided (e.g., entirely provided) in the first to third pixels PXL1, PXL2, and PXL3. The planarization layer PLL may include an organic material such as an acrylic resin, an epoxy resin, a phenolic resin, a polyamide resin, a polyimide rein, a polyester resin, a polyphenylenesulfide resin, or a benzocyclobutene (BCB). However, embodiments are not limited thereto, and the planarization layer PLL may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The color filter layer CFL may be disposed on the planarization layer PLL. The color filter layer CFL may include color filters CF1, CF2, and CF3 matching (or corresponding to) the color of each pixel PXL. A full-color image may be displayed by disposing the color filters CF1, CF2, and CF3 matching (or corresponding to) respective colors of the first to third pixels PXL1, PXL2, and PXL3.

The color filter layer CFL may include the first color filter CF1 that is disposed in the first pixel PXL1 to selectively transmit light emitted by the first pixel PXL1, the second color filter CF2 that is disposed in the second pixel PXL2 to selectively transmit light emitted by the second pixel PXL2, and the third color filter CF3 that is disposed in the third pixel PXL3 to selectively transmit light emitted by the third pixel PXL3.

In an embodiment, the first color filter CF1, the second color filter CF2, and the third color filter CF3 may be a red color filter, a green color filter, and a blue color filter respectively, but embodiments are not limited thereto. Hereinafter, referring to one of the first color filter CF1, the second color filter CF2, and the third color filter CF3, or comprehensively referring to two or more thereof, it will be referred to as the "color filter CF" or "color filters CF".

The first color filter CF1 may overlap the first color conversion layer CCL1 in the third direction (e.g., Z-axis direction). The first color filter CF1 may include a color filter material that selectively transmits light of a first color (e.g., red color). For example, in case that the first pixel PXL1 is a red pixel, the first color filter CF1 may include a red color filter material.

The second color filter CF2 may overlap the second color conversion layer CCL2 in the third direction (e.g., Z-axis direction). The second color filter CF2 may include a color filter material that selectively transmits light of a second color (e.g., green color). For example, in case that the second pixel PXL2 is a green pixel, the second color filter CF2 may include a green color filter material.

The third color filter CF3 may overlap the scattering layer LSL in the third direction (e.g., Z-axis direction). The third color filter CF3 may include a color filter material that selectively transmits light of a third color (e.g., blue color). For example, in case that the third pixel PXL3 is a blue pixel, the third color filter CF3 may include a blue color filter material.

The light blocking layer BM may be disposed on the color conversion layer CCL. The light blocking layer BM may be disposed between the first to third pixels PXL1, PXL2, and PXL3, and may at least partially overlap the first to third pixels PXL1, PXL2, and PXL3, respectively. The light blocking layer BM may prevent color mixing defects that are viewed from the front or side surface of the display device. A material of the light blocking layer BM is not limited, and the light blocking layer BM may be made of various light blocking materials. In some embodiments, the light blocking layer BM may be implemented by stacking the first to third color filters CF1, CF2, and CF3 on each other, but embodiments are not limited thereto.

An overcoat layer OC may be disposed on the color filter layer CFL and the light blocking layer BM. The overcoat layer OC may be provided (e.g., entirely provided) in the first to third pixels PXL1, PXL2, and PXL3. The overcoat layer OC may cover the color filter layer CFL and a lower member thereof. The overcoat layer OC may prevent moisture or air from penetrating (or permeating) into the above-mentioned lower members that are disposed therebelow. The overcoat layer OC may protect the above-mentioned lower members from foreign matters such as dust.

The overcoat layer OC may include an organic material such as an acrylic resin, an epoxy resin, a phenolic resin, a polyamide resin, a polyimide rein, a polyester resin, a polyphenylenesulfide resin, or a benzocyclobutene (BCB). However, embodiments are not limited thereto, and the overcoat layer OC may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:

a first light emitting element disposed in a first light emitting area;

a second light emitting element disposed in a second light emitting area;

a first contact electrode electrically connected to a first end portion of the first light emitting element, the first contact electrode having a first end and a second end opposite to the first end;

a second contact electrode electrically connected to a second end portion of the first light emitting element;

a third contact electrode electrically connected to a first end portion of the second light emitting element, an end of the third contact electrode and the second end of the first contact electrode facing toward each other; and a connection electrode electrically connected to the second contact electrode and extending around and bypassing the first end of the first contact electrode to be electrically connected to the third contact electrode.

2. The display device of claim 1, wherein the connection electrode and the first contact electrode are disposed on a same layer.

3. The display device of claim 2, wherein the first contact electrode and the second contact electrode are disposed on the same layer.

4. The display device of claim 2, further comprising:

an insulating layer disposed between the first contact electrode and the second contact electrode.

5. The display device of claim 1, further comprising:

a non-light emitting area disposed between the first light emitting area and the second light emitting area.

6. The display device of claim 5, wherein the first contact electrode, the second contact electrode, and the third contact electrode do not overlap the non-light emitting area.

7. The display device of claim 5, wherein the connection electrode overlaps the non-light emitting area.

8. The display device of claim 1, further comprising:

electrodes spaced apart from each other in the first light emitting area and the second light emitting area.

9. The display device of claim 8, wherein the first light emitting element and the second light emitting element are disposed between the electrodes.

10. The display device of claim 1, further comprising:

a fourth contact electrode electrically connected to a second end portion of the second light emitting element.

11. An electronic device comprising:

a first light emitting area, a second light emitting area, and a non-light emitting area between the first light emitting area and the second light emitting area;

a first light emitting element disposed in the first light emitting area;

a second light emitting element disposed in the second light emitting area;

a first contact electrode electrically connected to a first end portion of the first light emitting element, the first contact electrode having a first end and a second end opposite to the first end;

a second contact electrode electrically connected to a second end portion of the first light emitting element;

a third contact electrode electrically connected to a first end portion of the second light emitting element, an end of the third contact electrode and the second end of the first contact electrode facing toward each other; and a first connection electrode extending around the first end of the first contact electrode and electrically connecting the second contact electrode and the third contact electrode to each other, wherein the first contact electrode, the second contact electrode, and the third contact electrode do not overlap the non-light emitting area.

12. The electronic device of claim 11, wherein the first connection electrode extends to cross the non-light emitting area.

13. The electronic device of claim 11, wherein the first connection electrode, the first contact electrode, the second contact electrode, and the third contact electrode are disposed on a same layer.

14. The electronic device of claim 11, further comprising:

a fourth contact electrode electrically connected to a second end portion of the second light emitting element.

15. The electronic device of claim 14, wherein the fourth contact electrode does not overlap the non-light emitting area.

16. The electronic device of claim 14, further comprising:

a third light emitting element disposed in the first light emitting area.

17. The electronic device of claim 16, further comprising:

a fifth contact electrode electrically connected to a first end portion of the third light emitting element.

18. The electronic device of claim 17, wherein the fifth contact electrode does not overlap the non-light emitting area.

19. The electronic device of claim 17, further comprising:

a second connection electrode electrically connecting the fourth contact electrode and the fifth contact electrode.

20. A display device comprising:

a first light emitting area, a second light emitting area, and a non-light emitting area between the first light emitting area and the second light emitting area;

a first light emitting element disposed in the first light emitting area;

a second light emitting element disposed in the second light emitting area;

a first contact electrode electrically connected to a first end portion of the first light emitting element;

a second contact electrode electrically connected to a second end portion of the first light emitting element;

a third contact electrode electrically connected to a first end portion of the second light emitting element;

a first connection electrode electrically connecting the second contact electrode and the third contact electrode to each other;

a fourth contact electrode electrically connected to a second end portion of the second light emitting element;

a third light emitting element disposed in the first light emitting area;

a fifth contact electrode electrically connected to a first end portion of the third light emitting element; and a second connection electrode electrically connecting the fourth contact electrode and the fifth contact electrode to each other, wherein the first contact electrode, the second contact electrode, and the third contact electrode do not overlap the non-light emitting area, and wherein the second connection electrode extends to cross the non-light emitting area.

* * * * *